(12) United States Patent
Moriyama et al.

(10) Patent No.: US 7,474,548 B2
(45) Date of Patent: Jan. 6, 2009

(54) SEMICONDUCTOR MEMORY DEVICE AND METHOD FOR MANUFACTURING THE SAME

(75) Inventors: Yoshiya Moriyama, Osaka (JP); Yuji Harada, Hyogo (JP); Keita Takahashi, Nara (JP)

(73) Assignee: Panasonic Corporation, Osaka (JP)

( * ) Notice: Subject to any disclaimer, the term of this patent is extended or adjusted under 35 U.S.C. 154(b) by 250 days.

(21) Appl. No.: 11/637,939

(22) Filed: Dec. 13, 2006

(65) Prior Publication Data
US 2007/0152265 A1 Jul. 5, 2007

(30) Foreign Application Priority Data
Dec. 13, 2005 (JP) ............... 2005-358969

(51) Int. Cl.
*G11C 5/06* (2006.01)
(52) U.S. Cl. ............... 365/63; 365/105; 365/190; 365/243
(58) Field of Classification Search ............... 365/63, 365/105, 190, 243
See application file for complete search history.

(56) References Cited
U.S. PATENT DOCUMENTS
5,345,414 A * 9/1994 Nakamura ............... 365/145

6,826,080 B2 * 11/2004 Park et al. ............... 365/185.05

FOREIGN PATENT DOCUMENTS
JP 10-173157 A 6/1998

\* cited by examiner

*Primary Examiner*—Pho M. Luu
(74) *Attorney, Agent, or Firm*—McDermott Will & Emery LLP

(57) ABSTRACT

A semiconductor memory device includes: a memory cell array region formed in a semiconductor region of a first conductivity type and having a plurality of memory cells arranged in rows and columns; a plurality of word lines each of which collectively connects ones of the plurality of memory cells aligned in the same row; and a protective diode region formed in the semiconductor region to be separated from the memory cell array region. In the protective diode region, a protective diode element is constructed by making a junction between a first diffusion layer of a second conductivity type formed in the upper portion of the semiconductor region and the semiconductor region. Each of the word lines extends to the protective diode region and is brought into direct connection to the first diffusion layer of the second conductivity type, thereby making electrical connection to the protective diode element.

26 Claims, 23 Drawing Sheets

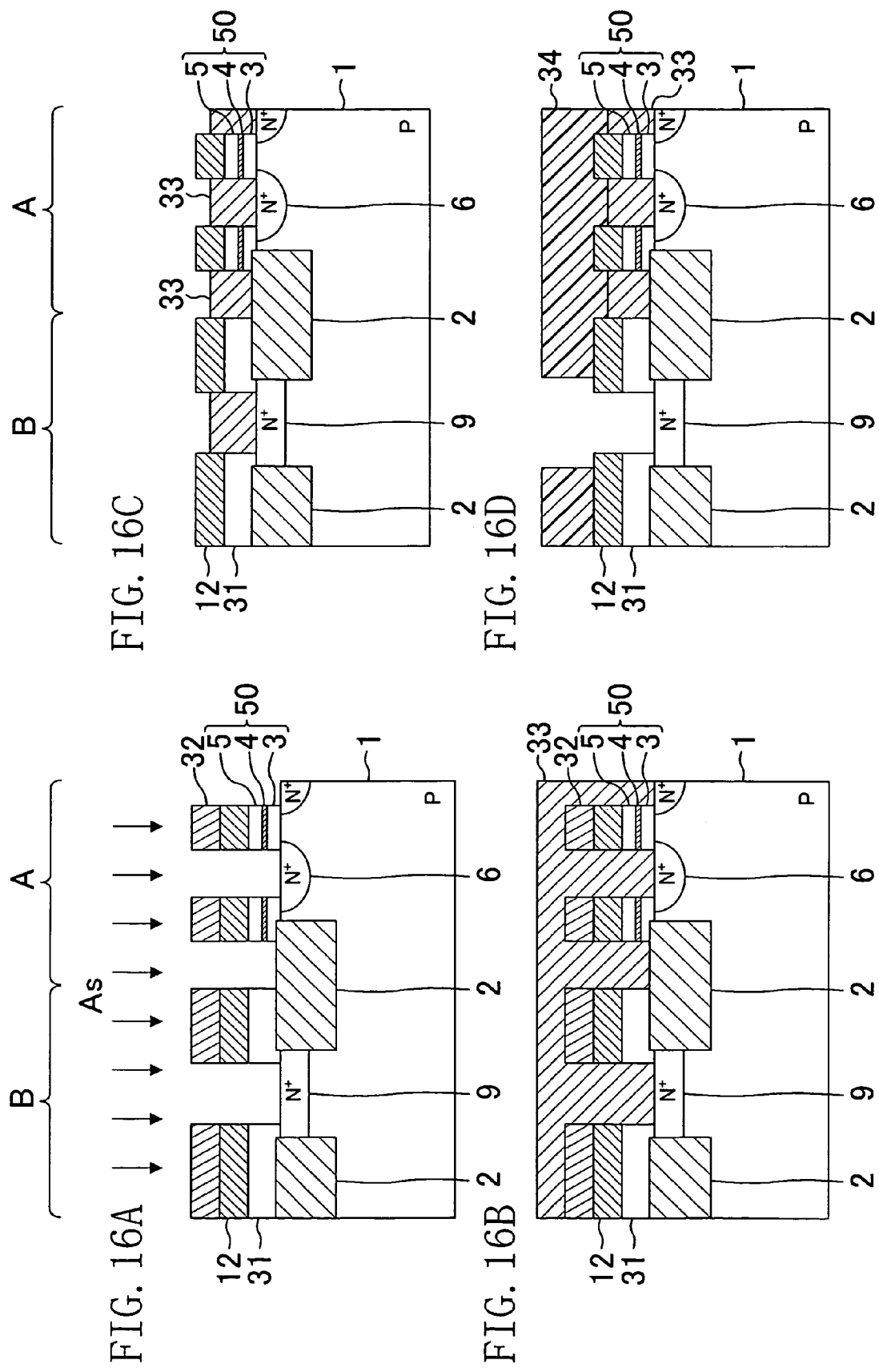

SEMICONDUCTOR MEMORY DEVICE AND METHOD FOR MANUFACTURING THE SAME

CROSS REFERENCE TO RELATED APPLICATIONS

This application claims priority under 35 U.S.C. § 119 on Patent Application No. 2005-358969 filed in Japan on Dec. 13, 2005, the entire contents of which are hereby incorporated by reference.

BACKGROUND OF THE INVENTION (a) Fields of the Invention

The present invention relates to semiconductor memory devices, and in particular to nonvolatile semiconductor memory devices such as EEPROMs (electrically erasable programmable read-only memories).

(b) Description of Related Art

In a semiconductor memory device, the state of data, "0" or "1", stored in a memory cell to be read is determined in the manner in which a predetermined voltage is applied to a gate electrode of the target memory cell to utilize a change in threshold voltage differing depending on the quantity of electrical charges in a charge storage layer thereof. To operate the device in this manner, in the device, a memory cell array is constructed so that in a plurality of memory cells, collective connection is made among respective gate electrodes, respective drain regions, and respective source regions and that the memory cells are arranged in rows and columns on a semiconductor substrate. The gate electrodes of the memory cells continuously extend along the row direction of the memory cell array, and serve as a word line. The drain regions of the memory cells aligned along the column direction of the memory cell array are collectively connected to a bit line, and the source regions thereof aligned along the column direction of the memory cell array are collectively connected to a source line.

In the memory cell array, a protective diode is typically connected to an end of the word line in order to prevent the gate electrode from being electrically charged during a device fabrication process as will be described below.

FIG. 32 shows a cross-sectional structure of a connecting portion between a word line and a protective diode in a conventional memory cell array used in general (see, for example, Japanese Unexamined Patent Publication No. H10-173157).

Referring to FIG. 32, in the upper portion of a p-type semiconductor substrate (or a p-type well) 101, a memory cell array region A and a protective diode region B are formed which are defined by an isolation insulating film 102. In the memory cell array region A, a plurality of gate insulating films are disposed in rows and columns, and each of the gate insulating films is formed by sequentially stacking a first gate oxide film 103, a charge storage layer 104, and a second gate oxide film 105 on the p-type semiconductor substrate 101. On the second gate oxide films 105, a plurality of word lines 108 are formed which extend in the row direction and also serve as gate electrodes.

A source/drain diffusion layer 106 is formed in an area of the upper portion of the p-type semiconductor substrate 101 which is located between the gate insulating films extending in the column direction. An insulating film 107 is formed between the source/drain diffusion layer 106 and the word line 108.

In the protective diode region B adjacent to the memory cell array region A, the n-type diffusion layer 109 is formed in the upper region of the p-type semiconductor substrate 101. The n-type diffusion layer 109 and the p-type semiconductor substrate 101 constitute a protective diode element.

The n-type diffusion layer 109 of the protective diode element and an end of the word line 108 are electrically connected through a first metal interconnect 111 and contacts 110 made of refractory metal.

In various processes for forming the semiconductor memory device, particularly in formation processes using plasma, resulting electrical charging of the word line 108 may raise the potential of the word line 108. In this case, if no current pass is provided to the word line 108, voltage drop at the word line 108 does not occur and thus the word line 108 is kept at a high potential. For example, positive charging of the word line 108 is equivalent to the state in which a positive voltage is applied to the word line 108. As a result, electrons are injected from the source/drain diffusion layer 106 to the charge storage layer 104. On the other hand, negative charging of the word line 108 is equivalent to the state in which a negative voltage is applied to the word line 108. As a result, holes are injected from the source/drain diffusion layer 106 to the charge storage layer 104 or electrons are injected from the word line 108 to the charge storage layer 104.

As described above, in the memory cell, the state of data, "0" or "1", is determined by sensing a change in threshold voltage caused by storing charges in the charge storage layer 104. Therefore, the threshold value of the memory cell immediately after completion of fabrication is affected by the change in the quantity of charges in the charge storage layer 104 due to electrical charging of the word line 108 during the formation processes, which will cause malfunction in determining data. Furthermore, the state in which the potential of the word line 108 becomes high due to electrical charging gives stress to the gate oxide films 103 and 105, which disadvantageously degrades the film qualities of the gate oxide films 103 and 105 to shorten their lifetime.

In order to deal with this problem, generally, as shown in FIG. 32, the word line 108 is connected through, for example, the first metal interconnect 111 to the protective diode region B. Thereby, the word line 108 is protected from a high voltage applied in formation processes subsequent to the word line formation process.

However, in the conventional method for fabricating a semiconductor memory device, when the approach of connecting the word line 108 to the protective diode region B through an interconnect layer such as the first metal interconnect 111 is taken, the functions of the protective diode region B cannot be utilized by the time the interconnect layer is formed, specifically, until a conductive film for forming an initial interconnect layer is deposited.

In particular, in the formation process of the contact 110 shown in FIG. 32, a thermal treatment at a relatively high temperature (650° C. or higher) can be performed before formation of a refractory metal film made of, for example, tungsten used as the material for the contact 110. Even though charges are stored in the charge storage layer 104 by electrical charging of the word line 108 during the fabrication process, addition of high-temperature thermal treatment allows release of the stored charges. However, such a high-temperature thermal treatment cannot be performed after formation of the refractory metal film for contact formation, so that it is impossible to release charges stored in the charge storage layer 104.

Typically, in a contact formation process, plasma is used in sputtering growth of a metal film including dry etching of a contact hole, and the like. Thus, the approach of connecting the word line and the protective diode region through the interconnect layer causes a problem that charge injection into the charge storage layer due to electrical charging of the word line cannot be prevented during a period of time between the instant when deposition of a conductive layer for word line formation and subsequent formation of the refractory metal film in the contact formation process are both completed and the instant when the interconnect layer is formed, to be more specific, the instant when the conductive film for forming the initial interconnect layer is deposited.

SUMMARY OF THE INVENTION

An object of the present invention is to solve the conventional problems described above and to provide a semiconductor memory device capable of protecting a memory cell from a high voltage applied by electrical charging of a word line even in processes subsequent to deposition of a conductive layer for word line formation.

To attain the above object, in the present invention, a semiconductor memory device is designed so that a conductive film for word line formation is in direct contact with a protective diode region.

To be more specific, a semiconductor memory device according to the present invention is characterized in that the device includes: a memory cell array region formed in a semiconductor region of a first conductivity type and having a plurality of memory cells arranged in rows and columns; a plurality of word lines each of which collectively connects ones of the plurality of memory cells aligned in the same row; and a protective diode region formed in the semiconductor region to be separated from the memory cell array region. This device is further characterized in that in the protective diode region, a protective diode element is constructed by making a junction between a first diffusion layer of a second conductivity type formed in the upper portion of the semiconductor region and the semiconductor region, and each of the word lines extends to the protective diode region and is brought into direct connection to the first diffusion layer of the second conductivity type, thereby making electrical connection to the protective diode element.

With the semiconductor memory device according to the present invention, each of the word lines extends to the protective diode region and is brought into direct connection to the first diffusion layer of the second conductivity type, thereby making electrical connection to the protective diode element. Thus, once the conductive film for word line formation is formed, the protective diode element works. That is to say, for example, in the case where the first conductivity type is p-type and the second conductivity type is n-type, once the word line is brought into connection to the first diffusion layer of the second conductivity type in the protective diode region, negative charge in the word line (gate electrode) generated in the formation processes is provided with a current pass serving as a forward voltage for the pn junction. Therefore, the word line will not have a negative potential with a large absolute value. Also, for positive charge in the word line generated in the formation processes, it will not have a potential equal to or higher than the reverse voltage for the pn junction. As a result, charge injection into an charge storage layer caused by electrical charging of the word line can be prevented even in processes between formation of a refractory metal film in a contact formation process and a deposition of an interconnect layer, during which that charge injection cannot be prevented by the conventional approach in which the word line and the protective diode are connected through the interconnect layer. Note that the above effects are described in the case where the first conductivity type is p-type and the second conductivity type is n-type. However, it goes without saying that even in the reverse case where the first conductivity type is n-type and the second conductivity type is p-type, the same effects as those described above can be exerted because the two cases are opposite merely in charging direction, that is, the forward and reverse directions.

Preferably, in the semiconductor memory device according to the present invention, the protective diode region further includes: a well of the first conductivity type formed of the semiconductor region; a first well of the second conductivity type adjacent to the side of the well of the first conductivity type located away from the memory cell array region; and a first diffusion layer of the first conductivity type formed in the upper portions of the well of the first conductivity type and the first well of the second conductivity type to extend across the junction therebetween, and the protective diode element is constructed of the first diffusion layer of the second conductivity type, the well of the first conductivity type, the first diffusion layer of the first conductivity type, and the first well of the second conductivity type.

With this device, for example, in the case where the first conductivity type is p-type and the second conductivity type is n-type, once the word line is brought into connection to the first diffusion layer of the second conductivity type within the well of the first conductivity type in the protective diode region, negative charge in the word line generated in the formation processes produces a reverse voltage for the pn junction at the junction in the protective diode region between the first well of the second conductivity type and the first diffusion layer of the first conductivity type formed in the upper portion of the junction between the well of the first conductivity type and the first well of the second conductivity type to extend across the junction therebetween. Therefore, the word line will not have a negative potential with a larger absolute value than the reverse voltage. Also, positive charge in the word line generated in the formation processes produces a reverse voltage for the pn junction at the junction in the protective diode region between the well of the first conductivity type and the first diffusion layer of the second conductivity type in the upper portion of the well of the first conductivity type. Therefore, the word line will not have a high positive potential equal to or higher than the reverse voltage. As a result, charge injection into the charge storage layer caused by electrical charging of the word line can be prevented. Moreover, even when a negative voltage is applied to the word line, the absolute value of the negative potential of the word line can be raised. Therefore, a device capable of applying a negative voltage to the word line can be realized.

Preferably, in the semiconductor memory device according to the present invention, the well of the first conductivity type and the first well of the second conductivity type are formed in a semiconductor substrate of the first conductivity type, the protective diode region further includes: a second well of the second conductivity type containing the well of the first conductivity type and the first well of the second conductivity type and having a junction plane deeper than the well of the first conductivity type and the first well of the second conductivity type; and a second diffusion layer of the second conductivity type formed in the upper portions of the first well of the second conductivity type and the semiconductor substrate to extend across the junction therebetween, and the protective diode element is constructed of the first diffusion layer of the second conductivity type, the well of the first conductivity type, the first diffusion layer of the first conductivity type, the first well of the second conductivity type, the second well of the second conductivity type, and the second diffusion layer of the second conductivity type.

With this device, for example, in the case where the first conductivity type is p-type and the second conductivity type is n-type, once the word line is brought into connection to the first diffusion layer of the second conductivity type in the protective diode region, negative charge in the word line generated in the formation processes produces a reverse voltage for the pn junction at the junction in the protective diode region between the first well of the second conductivity type and the first diffusion layer of the first conductivity type formed in the upper portions of the well of the first conductivity type and the first well of the second conductivity type to extend across the junction therebetween. Therefore, the word line will not have a negative potential with a larger absolute value than the reverse voltage. Also, positive charge in the word line generated in the formation processes produces a reverse voltage for the pn junction at two points in the protective diode region: the one point is the junction between the well of the first conductivity type and the first diffusion layer of the second conductivity type within the well of the first conductivity type; and the other point is the junction between the semiconductor substrate of the first conductivity type and the second diffusion layer of the second conductivity type formed in the upper portions of the semiconductor substrate and the first well of the second conductivity type to extend across the junction therebetween. Therefore, the word line will not have a high positive potential equal to or higher than the reverse voltage. As a result, charge injection into the charge storage layer caused by electrical charging of the word line can be prevented. Moreover, even when a negative voltage is applied to the word line, the absolute value of the negative potential of the word line can be raised. Therefore, a device capable of applying a negative voltage to the word line can be realized.

Preferably, in the semiconductor memory device according to the present invention, the well of the first conductivity type and the first well of the second conductivity type are formed in a semiconductor substrate of the first conductivity type, the protective diode region further includes: a second well of the second conductivity type containing the well of the first conductivity type and the first well of the second conductivity type and having a junction plane deeper than the well of the first conductivity type and the first well of the second conductivity type; a first silicide region made from metal and formed on top of the first diffusion layer of the first conductivity type; and a second silicide region made from metal and formed on top of the first well of the second conductivity type and the semiconductor substrate to extend across the junction therebetween, and the protective diode element is constructed of the first diffusion layer of the second conductivity type, the well of the first conductivity type, the first diffusion layer of the first conductivity type, the first silicide region, the first well of the second conductivity type, the second well of the second conductivity type, and the second silicide region.

With this device, for example, in the case where the first conductivity type is p-type and the second conductivity type is n-type, once the word line is brought into connection to the first diffusion layer of the second conductivity type in the protective diode region, negative charge in the word line generated in the formation processes produces a reverse voltage for the pn junction at the junction in the protective diode region between the first well of the second conductivity type and the first diffusion layer of the first conductivity type formed in the upper portions of the well of the first conductivity type and the first well of the second conductivity type to extend across the junction therebetween. Therefore, the word line will not have a negative potential with a larger absolute value than the reverse voltage. Also, positive charge in the word line generated in the formation processes produces a reverse voltage for the pn junction at the junction in the protective diode region between the well of the first conductivity type and the first diffusion layer of the second conductivity type within the well of the first conductivity type. Therefore, the word line will not have a high positive potential equal to or higher than the reverse voltage. As a result, charge injection into the charge storage layer caused by electrical charging of the word line can be prevented. Moreover, even when a negative voltage is applied to the word line, the absolute value of the negative potential of the word line can be raised. Therefore, a device capable of applying a negative voltage to the word line can be realized. Furthermore, in the case where a high positive voltage is applied to the word line, a reverse voltage is placed on only one point by the time a current flows into the semiconductor substrate. This facilitates control of the breakdown voltage and stabilizes device operations.

Preferably, in the semiconductor memory device according to the present invention, the well of the first conductivity type and the first well of the second conductivity type are formed in a semiconductor substrate of the first conductivity type, the protective diode region further includes: a second well of the second conductivity type containing the well of the first conductivity type and the first well of the second conductivity type and having a junction plane deeper than the well of the first conductivity type and the first well of the second conductivity type; a second diffusion layer of the second conductivity type formed in the upper portion of the first well of the second conductivity type away from the first diffusion layer of the first conductivity type; and a second diffusion layer of the first conductivity type formed in the upper portion of the semiconductor substrate adjacent to the second diffusion layer of the second conductivity type, and the protective diode element is constructed of the first diffusion layer of the second conductivity type, the well of the first conductivity type, the first diffusion layer of the first conductivity type, the first well of the second conductivity type, the second well of the second conductivity type, the second diffusion layer of the second conductivity type, and the second diffusion layer of the first conductivity type.

With this device, for example, in the case where the first conductivity type is p-type and the second conductivity type is n-type, once the word line is brought into connection to the diffusion layer of the second conductivity type in the protective diode region, negative charge in the word line generated in the formation processes produces a reverse voltage for the pn junction at the junction in the protective diode region between the first well of the second conductivity type and the first diffusion layer of the first conductivity type formed in the upper portions of the well of the first conductivity type and the first well of the second conductivity type to extend across the junction therebetween. Therefore, the word line will not have a negative potential with a larger absolute value than the reverse voltage. Also, positive charge in the word line generated in the formation processes produces a reverse voltage for the pn junction at two points in the protective diode region: the one point is the junction between the well of the first conductivity type and the first diffusion layer of the second conductivity type within the well of the first conductivity type; and the other point is the junction between the second diffusion layer of the second conductivity type within the first well of the second conductivity type and the second diffusion layer of the first conductivity type in the semiconductor substrate of the first conductivity type. Therefore, the word line will not have a high positive potential equal to or higher than the reverse voltage. As a result, charge injection into the charge storage layer caused by electrical charging of the word line can be prevented. Moreover, even when a negative voltage is applied to the word line, the absolute value of the negative potential of the word line can be raised. Therefore, a device capable of applying a negative voltage to the word line can be realized. Furthermore, since in the protective diode region, the impurity concentration of the pn junction between the second diffusion layer of the second conductivity type within the first well of the second conductivity type and the second diffusion layer of the first conductivity type in the semiconductor substrate can be increased easily, this junction can be designed to have a more lowered pn-junction breakdown voltage. This facilitates control of the breakdown voltage and stabilizes device operations.

Preferably, in the semiconductor memory device according to the present invention, a first silicide region made from metal is formed on top of the first diffusion layer of the first conductivity type, and a second silicide region made from metal is formed on top of the second diffusion layer of the second conductivity type.

With this device, the silicide can provide more reduced resistances of the first diffusion layer of the first conductivity type and the second diffusion layer of the second conductivity type. Therefore, in the case where the word line is positively or negatively charged in a certain formation process to apply to the word line a voltage equal to or higher than the reverse breakdown voltage of the protective diode element, a current generated can be readily passed to the semiconductor substrate. As a result, for example, stress to the gate insulating film or charge injection of the charge storage layer in the memory cell can be suppressed certainly.

Preferably, in the semiconductor memory device according to the present invention, a first silicide region made from metal is formed on top of the first diffusion layer of the first conductivity type, and a second silicide region made from metal is formed to extend across the top of the second diffusion layer of the second conductivity type and the top of the second diffusion layer of the first conductivity type.

With this device, metal silicide connects the second diffusion layer of the second conductivity type and the second diffusion layer of the first conductivity type in the protective diode region. Therefore, in the case where a high positive voltage is applied to the word line, a reverse voltage is placed on only one point, that is, the junction in the protective diode region between the well of the first conductivity type and the diffusion layer of the second conductivity type within the well of the first conductivity type by the time a current flows into the semiconductor substrate. This facilitates control of the breakdown voltage and stabilizes device operations.

Preferably, in the semiconductor memory device according to the present invention, an insulating film is formed between the adjacent memory cells in the memory cell array region, and the insulating film is not formed on the first diffusion layer of the second conductivity type in the protective diode region.

With this device, in the memory cell array region, the space between the adjacent memory cells is certainly filled with the insulating film, and in the protective diode region, no insulating film is formed on the first diffusion layer of the second conductivity type. Therefore, the word line and the diffusion layer of the second conductivity type can be directly connected in a smaller size than the case where the insulating film is formed on the first diffusion layer of the second conductivity type.

Preferably, in the semiconductor memory device according to the present invention, the word lines are constructed of: first conductive layers formed in the plurality of memory cells, respectively; and second conductive layers each of which collectively connects ones of the multiple first conductive layers aligned in the same row.

With this device, the word line and the first diffusion layer of the second conductivity type in the protective diode region are connected to each other in a self-aligned manner, and the word line and the first conductive layer are directly connected to each other.

Preferably, in the semiconductor memory device according to the present invention, the memory cells are MONOS-type memory cells which each have a stacked insulating film formed between the first semiconductor region and associated one of the first conductive layers and made by interposing a nitride film between oxide films.

Preferably, in the semiconductor memory device according to the present invention, the word lines are constructed of: first conductive layers formed in the plurality of memory cells, respectively; and second conductive layers each of which capacitively couples ones of the multiple first conductive layers aligned in the same row so that an insulating film is interposed therebetween.

With this device, the word line and the first diffusion layer of the second conductivity type in the protective diode region are connected to each other in a self-aligned manner, and the word line and the first conductive layer are capacitively coupled with the insulating film interposed therebetween.

Preferably, in the above case, the memory cells are floating gate electrode-type memory cells each having a tunnel insulating film formed between the first semiconductor region and associated one of the first conductive layers.

A first method for fabricating a semiconductor memory device according to the present invention is directed for a method for fabricating a semiconductor memory device in which a memory cell array region having a plurality of memory cells arranged in rows and columns and a protective diode region are formed separately on a semiconductor region of a first conductivity type. The first method is characterized in that the method includes: the step (a) of selectively forming an isolation insulating film in the semiconductor region; the step (b) of sequentially forming, on the semiconductor region including the isolation insulating film, an ONO film including a first silicon oxide film, a silicon nitride film, and a second silicon oxide film, and a first conductive layer; the step (c) of patterning, in the memory cell array region, the first conductive layer and the ONO film in rectangular shapes extending in the column direction, and also patterning, in the protective diode region, the first conductive layer for removal; the step (d) of forming, after the step (c), a source/drain region of each of the memory cells formed of a diffusion layer of a second conductivity type in the memory cell array region in the semiconductor region, and also a diffusion layer of the second conductivity type forming a protective diode element in the protective diode region in the semiconductor region, the step (d) being performed using the patterned first conductive layer as a mask; the step (e) of forming, after the step (d), an insulating film on the semiconductor region including the patterned first conductive layer, and then exposing the top surface of the patterned first conductive layer in the memory cell array region; the step (f) of exposing, after the step (d), at least a portion of the diffusion layer of the second conductivity type in the protective diode region; the step (g) of forming, after the step (f), a second conductive layer over the memory cell array region and the protective diode region in the semiconductor region; and the step (h) of patterning, after the step (g), in the memory cell array region, the second conductive layer and the first conductive layer in the row direction to form the plurality of memory cells and a plurality of word lines, and also making, in the protective diode region, direct connection between the diffusion layer of the second conductivity type of the protective diode element and an end of an associated one of the word lines, the plurality of memory cells including the patterned first conductive layers, respectively, the plurality of memory cells being arranged in rows and columns, the plurality of word lines being formed of the patterned second conductive layers, respectively, the plurality of word lines each collectively connecting ones of the plurality of memory cells aligned in the same row.

With the first method for fabricating a semiconductor memory device, in the memory cell array region, the second conductive layer and the first conductive layer are patterned in the row direction to form: the plurality of memory cells which include the first conductive layers, respectively, and which are arranged in rows and columns; and the plurality of word lines which are formed of the second conductive layers, respectively, and each of which collectively connects memory cells aligned in the same row. Also, in the protective diode region with the surface exposed, patterning is conducted to directly connect the diffusion layer of the second conductivity type of the protective diode element to an end of the word line. Thus, in the memory cell formation process, the word line and the protective diode element are brought into connection at the same time in a self-aligned manner, so that stable electrical characteristics of the memory cell can be offered without adding a new step to the formation processes. Moreover, the protective diode element works in processes subsequent to deposition of the second conductive layer for word line formation. Therefore, charge injection into a charge storage layer caused by electrical charging of the word line can be prevented even in processes between formation of a refractory metal film in a contact formation process and deposition of an interconnect layer, during which that charge injection cannot be prevented by the conventional approach in which the word line and the protective diode element are connected through the interconnect layer.

Preferably, in the first method for fabricating a semiconductor memory device, the steps (e) and (f) are carried out in the manner in which the formed insulating film is etched to expose the top surfaces of the first conductive layers and fill spaces between the adjacent first conductive layers and the adjacent ONO films in the memory cell array region, and also to expose at least a portion of the diffusion layer of the second conductivity type in the protective diode region.

Preferably, in the first method for fabricating a semiconductor memory device, the step (e) is carried out in the manner in which the formed insulating film is polished by a chemical mechanical polishing method to expose the top surface of the first conductive layer in the memory cell array region, and the step (f) is carried out in the manner in which in the protective diode region, the insulating film is etched to expose at least a portion of the diffusion layer of the second conductivity type.

Preferably, in the first method for fabricating a semiconductor memory device, in the step (c), patterning is conducted to additionally remove the ONO film in the protective diode region.

Preferably, in the first method for fabricating a semiconductor memory device, the step (b) includes substeps of: selectively removing the ONO film in the protective diode region; and selectively forming a third silicon oxide film in the protective diode region with the ONO film removed therefrom.

A second method for fabricating a semiconductor memory device according to the present invention is directed for a method for fabricating a semiconductor memory device in which a memory cell array region having a plurality of memory cells arranged in rows and columns and a protective diode region are formed separately on a semiconductor region of a first conductivity type. The second method is characterized in that the method includes: the step (a) of selectively forming an isolation insulating film in the semiconductor region; the step (b) of sequentially forming a tunnel insulating film and a first conductive layer on the semiconductor region including the isolation insulating film; the step (c) of patterning, in the memory cell array region, the first conductive layer in rectangular shapes extending in the column direction, and also patterning, in the protective diode region, the first conductive layer for removal; the step (d) of forming, after the step (c), a source/drain region of each of the memory cells formed of a diffusion layer of a second conductivity type in the memory cell array region in the semiconductor region, and also a diffusion layer of the second conductivity type forming a protective diode element in the protective diode region in the semiconductor region, the step (d) being performed using the patterned first conductive layer as a mask; the step (e) of forming, after the step (d), an insulating film on the semiconductor region including the patterned first conductive layer, and then exposing the top surface of the patterned first conductive layer in the memory cell array region; the step (f) of exposing, after the step (d), at least a portion of the diffusion layer of the second conductivity type in the protective diode region; the step (g) of selectively forming, in the memory cell array region, a coupling capacitor insulating film on the first conductive layer with the top surface exposed; the step (h) of forming, after the step (g), a second conductive layer over the memory cell array region and the protective diode region in the semiconductor region; and the step (i) of patterning, after the step (h), in the memory cell array region, the second conductive layer, the coupling capacitor insulating film, and the first conductive layer in the row direction to form the plurality of memory cells and a plurality of word lines, and also making, in the protective diode region, direct connection between the diffusion layer of the second conductivity type of the protective diode element and an end of an associated one of the word lines, the plurality of memory cells including the patterned first conductive layers and the patterned coupling capacitor insulating films, respectively, the plurality of memory cells being arranged in rows and columns, the plurality of word lines being formed of the patterned second conductive layers, respectively, the plurality of word lines each collectively connecting ones of the plurality of memory cells aligned in the same row.

With the second method for fabricating a semiconductor memory device, in the memory cell array region, the second conductive layer, the coupling capacitor insulating film, and the first conductive layer are patterned in the row direction to form: the plurality of memory cells which include the first conductive layers and the coupling capacitor insulating films, respectively, and which are arranged in rows and columns; and the plurality of word lines which are formed of the second conductive layers, respectively, and each of which collectively connects memory cells aligned in the same row. Also, in the protective diode region with the surface exposed, patterning is made to directly connect the diffusion layer of the second conductivity type of the protective diode element to an end of the word line. Thus, in the memory cell formation process, the word line and the protective diode are brought into connection at the same time in a self-aligned manner, so that stable electrical characteristics of the memory cell can be offered without adding a new step to the formation processes. Moreover, the protective diode element works in processes subsequent to deposition of the second conductive layer for word line formation. Therefore, stress to the tunnel insulating film caused by electrical charging of the word line can be prevented even in processes between formation of a refractory metal film in a contact formation process and deposition of an interconnect layer, during which that stress cannot be prevented by an approach like the conventional example in which the word line and the protective diode element are connected through the interconnect layer.

Preferably, in the second method for fabricating a semiconductor memory device, the steps (e) and (f) are carried out in the manner in which the formed insulating film is etched to expose the top surfaces of the first conductive layers and fill spaces between the adjacent first conductive layers in the memory cell array region, and also to expose at least a portion of the diffusion layer of the second conductivity type in the protective diode region.

Preferably, in the second method for fabricating a semiconductor memory device, the step (e) is carried out in the manner in which the formed insulating film is polished by a chemical mechanical polishing method to expose the top surfaces of the first conductive layers in the memory cell array region, and the steps (f) and (g) are carried out in the manner in which in the protective diode region, the coupling capacitor insulating film and the insulating film are etched to expose at least a portion of the diffusion layer of the second conductivity type.

With this method, even in a fine pattern, the space between the adjacent first conductive layers in the memory cell array region can be certainly filled with an insulating film. Also, in the protective diode region, the diffusion layer of the second conductivity type in the protective diode region can be exposed certainly. Therefore, the distance between the memory cells can be reduced and in addition the size of the protective diode region can be reduced.

A first method for operating a semiconductor memory device according to the present invention is directed for, out of the semiconductor memory devices according to the present invention, the device in which the well of the first conductivity type and the first well of the second conductivity type are formed in a semiconductor substrate of the first conductivity type, the protective diode region further includes: a second well of the second conductivity type containing the well of the first conductivity type and the first well of the second conductivity type and having a junction plane deeper than the well of the first conductivity type and the first well of the second conductivity type; a second diffusion layer of the second conductivity type formed in the upper portion of the first well of the second conductivity type away from the first diffusion layer of the first conductivity type; and a second diffusion layer of the first conductivity type formed in the upper portion of the semiconductor substrate adjacent to the second diffusion layer of the second conductivity type, and the protective diode element is constructed of the first diffusion layer of the second conductivity type, the well of the first conductivity type, the first diffusion layer of the first conductivity type, the first well of the second conductivity type, the second well of the second conductivity type, the second diffusion layer of the second conductivity type, and the second diffusion layer of the first conductivity type. The first method is characterized in that the method includes the steps of: connecting a first terminal to the word line, a second terminal to the first diffusion layer of the first conductivity type, and a third terminal to the second diffusion layer of the second conductivity type and the second diffusion layer of the first conductivity type; and setting the second and third terminals to be grounded in applying a positive bias voltage to the first terminal.

With the first method for operating a semiconductor memory device, in the protective diode region, the potential of the well of the first conductivity type formed in the second well of the second conductivity type having a deep junction plane is stabilized. This enables stable write, erase, and read operations on the memory cell.

Preferably, the first method for operating a semiconductor memory device further includes the step of applying a positive bias voltage to the first terminal to perform one of write operation and read operation on a selected memory cell.

A second method for operating a semiconductor memory device according to the present invention is directed for, out of the semiconductor memory devices according to the present invention, the device in which the well of the first conductivity type and the first well of the second conductivity type are formed in a semiconductor substrate of the first conductivity type, the protective diode region further includes: a second well of the second conductivity type containing the well of the first conductivity type and the first well of the second conductivity type and having a junction plane deeper than the well of the first conductivity type and the first well of the second conductivity type; a second diffusion layer of the second conductivity type formed in the upper portion of the first well of the second conductivity type away from the first diffusion layer of the first conductivity type; and a second diffusion layer of the first conductivity type formed in the upper portion of the semiconductor substrate adjacent to the second diffusion layer of the second conductivity type, and the protective diode element is constructed of the first diffusion layer of the second conductivity type, the well of the first conductivity type, the first diffusion layer of the first conductivity type, the first well of the second conductivity type, the second well of the second conductivity type, the second diffusion layer of the second conductivity type, and the second diffusion layer of the first conductivity type. The second method is characterized in that the method includes the steps of: connecting a first terminal to the word line, a second terminal to the first diffusion layer of the first conductivity type, and a third terminal to the second diffusion layer of the second conductivity type and the second diffusion layer of the first conductivity type; and applying, in applying a negative bias voltage to the first terminal, the same voltage as the first terminal to the second terminal and setting the third terminal to be grounded.

Preferably, the second method for operating a semiconductor memory device further includes the step of applying a negative bias voltage to the first terminal to perform erase operation on a selected memory cell.

A third method for operating a semiconductor memory device according to the present invention is directed for, out of the semiconductor memory devices according to the present invention, the device in which the well of the first conductivity type and the first well of the second conductivity type are formed in a semiconductor substrate of the first conductivity type, the protective diode region further includes: a second well of the second conductivity type containing the well of the first conductivity type and the first well of the second conductivity type and having a junction plane deeper than the well of the first conductivity type and the first well of the second conductivity type; and a second diffusion layer of the second conductivity type formed in the upper portions of the first well of the second conductivity type and the semiconductor substrate to extend across the junction therebetween, and the protective diode element is constructed of the first diffusion layer of the second conductivity type, the well of the first conductivity type, the first diffusion layer of the first conductivity type, the first well of the second conductivity type, the second well of the second conductivity type, and the second diffusion layer of the second conductivity type. The third method is characterized in that the method includes the steps of: connecting a first terminal to the word line, a second terminal to the first diffusion layer of the first conductivity type, and a third terminal to the second diffusion layer of the second conductivity type; applying a positive bias voltage to the first terminal to perform one of write operation and read operation on a selected memory cell; and applying a negative bias voltage to the first terminal to perform erase operation to a selected memory cell.

A fourth method for operating a semiconductor memory device according to the present invention is directed for, out of the semiconductor memory devices according to the present invention, the device in which the well of the first conductivity type and the first well of the second conductivity type are formed in a semiconductor substrate of the first conductivity type, the protective diode region further includes: a second well of the second conductivity type containing the well of the first conductivity type and the first well of the second conductivity type and having a junction plane deeper than the well of the first conductivity type and the first well of the second conductivity type; a first silicide region made from metal and formed on top of the first diffusion layer of the first conductivity type; and a second silicide region made from metal and formed on top of the first well of the second conductivity type and the semiconductor substrate to extend across the junction therebetween, and the protective diode element is constructed of the first diffusion layer of the second conductivity type, the well of the first conductivity type, the first diffusion layer of the first conductivity type, the first silicide region, the first well of the second conductivity type, the second well of the second conductivity type, and the second silicide region. The fourth method is characterized in that the method includes the steps of: connecting a first terminal to the word line, a second terminal to the first silicide region, and a third terminal to the second silicide region; applying a positive bias voltage to the first terminal to perform one of write operation and read operation on a selected memory cell; and applying a negative bias voltage to the first terminal to perform erase operation on a selected memory cell.

As is apparent from the above, with the semiconductor memory device and its fabrication method according to the present invention, the memory cell can be protected from a high voltage applied by electrical charging of the word line in processes after deposition of the conductive layer for word line formation.

BRIEF DESCRIPTION OF THE DRAWINGS

FIGS. 16A to 16D are sectional views showing the method for fabricating a semiconductor memory device according to the sixth embodiment of the present invention in the order of its fabrication process steps.

BEST MODE FOR CARRYING OUT THE INVENTION

First Embodiment

A first embodiment of the present invention will be described with reference to the accompanying drawings. The first embodiment takes up, as one example, a nonvolatile semiconductor memory device having a charge storage layer in a gate insulating film.

Figure 1:
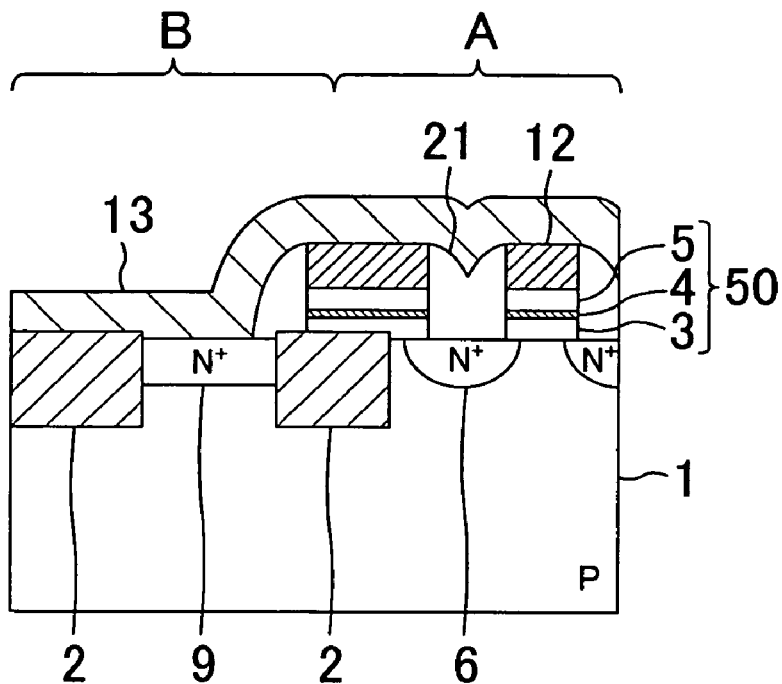
FIG. 1 is a sectional view showing a semiconductor memory device according to a first embodiment of the present invention.

FIG. 1 shows a cross-sectional structure of a semiconductor memory device according to the first embodiment of the present invention. Referring to FIG. 1, in the upper portion of a p-type well (or a p-type semiconductor substrate) 1 made of, for example, silicon, a memory cell array region A and a protective diode region B are formed which are defined by an isolation insulating film 2.

In the memory cell array region A, MONOS (metal oxide-nitride-oxide-semiconductor)-type memory cells are disposed in rows and columns. Each of the memory cells has a so-called ONO film 50 and a first conductive layer 12. The ONO film 50 is made, for example, by sequentially stacking a first gate insulating film 3 of silicon oxide, a charge storage layer 4 of silicon nitride, and a second gate insulating film 5 of silicon oxide.

The first conductive layer 12 of polycrystalline silicon or the like is formed on the ONO film 50 and constitutes a gate electrode.

A source/drain diffusion layer 6 is formed in an area of the upper portion of the p-type well 1 which is located between the ONO films 50 extending in the column direction (the direction perpendicular to the paper). An insulating film 21 is formed between the source/drain diffusion layer 6 and a second conductive layer 13.

In the protective diode region B adjacent to the memory cell array region A, an n-type diffusion layer 9 is formed in the upper region of the p-type well 1. The n-type diffusion layer 9 and the p-type well 1 constitute a protective diode element.

In the memory cell array region A, the second conductive layer 13 of, for example, polycrystalline silicon is formed which collectively connects gate electrodes of multiple memory cells aligned in the row direction of the memory cell array and which constitutes a word line and a gate electrode. The second conductive layer 13 extends to the protective diode region B and is directly connected to the n-type diffusion layer 9 in the protective diode region B.

With the first embodiment, once the second conductive layer 13 is brought into direct connection to the n-type diffusion layer 9 located within the p-type well 1 in the protective diode region B, negative charge in the second conductive layer 13 generated during the formation processes is provided with a current path serving as a forward voltage for a pn junction. Thereby, the second conductive layer 13 will not have a negative potential with a large absolute value. Also, for positive charge in the gate electrode generated during the formation processes, it will not have a potential higher than the reverse voltage for the pn junction. Therefore, by controlling the reverse voltage (breakdown voltage) to about 10 V, stress to the ONO film 50 and charge injection into the charge storage layer 4 of the ONO film 50 can be prevented or suppressed which are caused by applying a high voltage.

Figure 2:
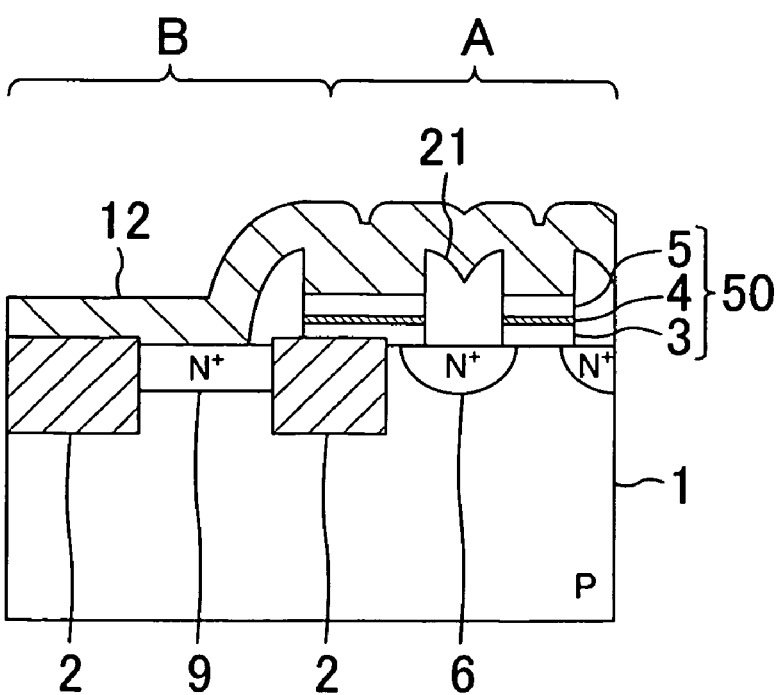
FIG. 2 is a sectional view showing a semiconductor memory device according to one modification of the first embodiment of the present invention.

Note that the above description is about an exemplary case where the gate electrode is composed of a stacked film of the first conductive layer 12 and the second conductive layer 13 and the word line is composed of the second conductive layer 13. Even in the case as shown in FIG. 2 where the gate electrode and the word line are formed only of the first conductive layer 12, the same effects as described above can be offered. Besides the first embodiment, the same holds true for the embodiments that follow.

Hereinafter, a fabrication method of the semiconductor memory device constructed as shown above according to the first embodiment will be described with reference to the accompanying drawings.

Figure 3A:
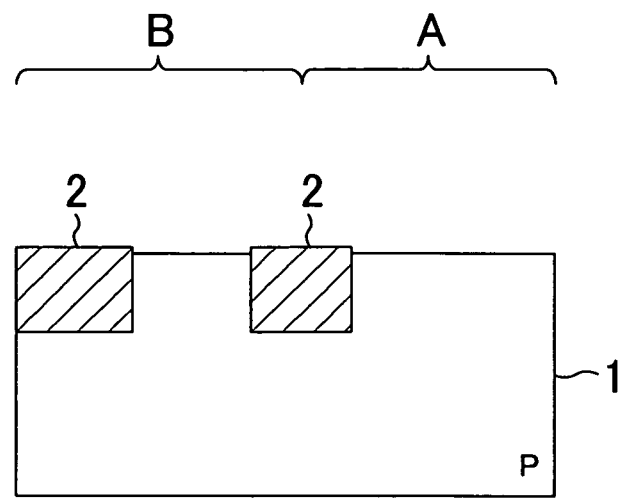
FIGS. 3A to 3C are sectional views showing a method for fabricating a semiconductor memory device according to the first embodiment of the present invention in the order of its fabrication process steps.

Referring to FIG. 3A, first, an isolation insulating film 2 of a shallow trench isolation (STI) structure is selectively formed in the upper portion of the p-type well 1.

Figure 3B:
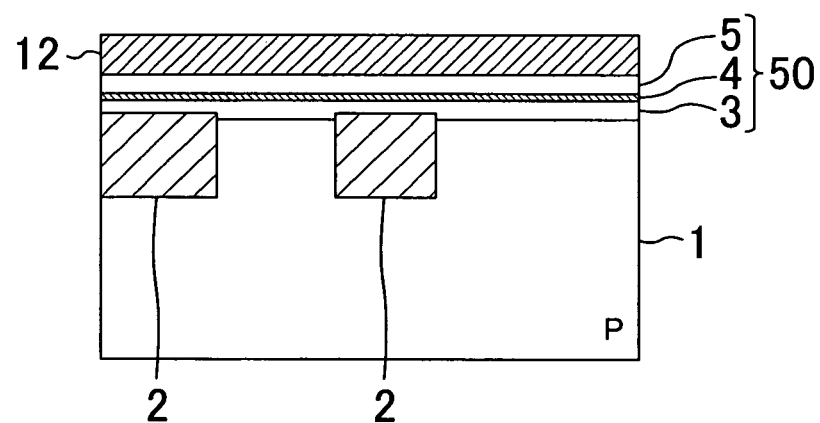

Next, as shown in FIG. 3B, by a chemical vapor deposition (CVD) method or the like, the first gate insulating film 3, the charge storage layer 4, the second gate insulating film 5, and the first conductive layer 12 of polycrystalline silicon are sequentially formed on the entire surface of the p-type well (or the p-type semiconductor substrate) 1 including the isolation insulating film 2.

Figure 3C:
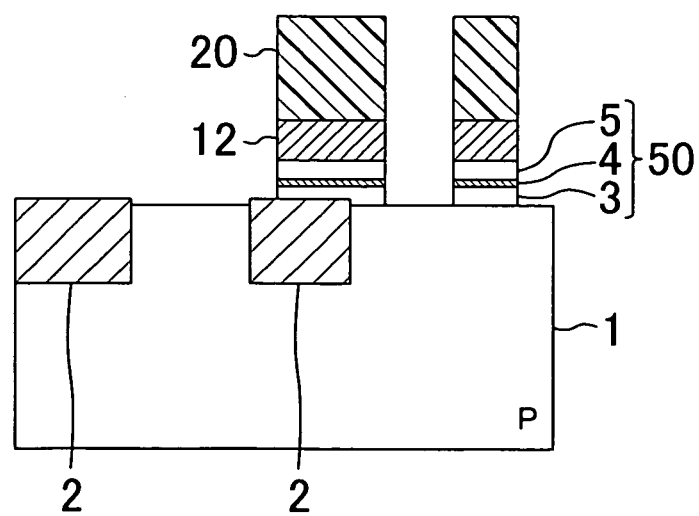

Subsequently, as shown in FIG. 3C, by a dry etching using a photoresist pattern 20 formed by a lithography method, portions of the first conductive layer 12, the second gate insulating film 5, the charge storage layer 4, and the first gate insulating film 3 located in the memory cell array region A are patterned in rectangular shapes extending in the column direction. In this etching, at least a portion of the top surface of the p-type well 1 is exposed in the protective diode region B.

Figure 4A:
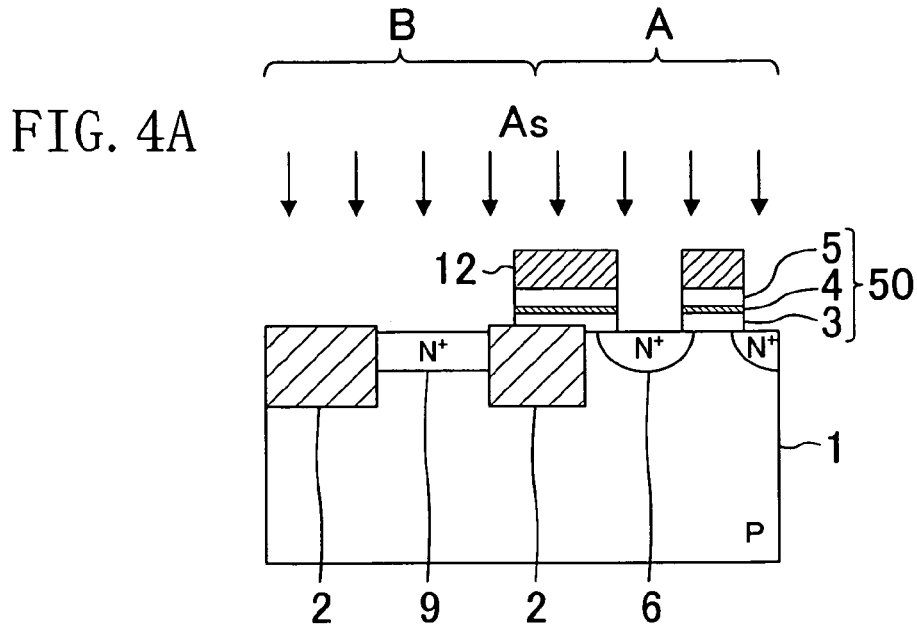
FIGS. 4A to 4C are sectional views showing the method for fabricating a semiconductor memory device according to the first embodiment of the present invention in the order of its fabrication process steps.

As shown in FIG. 4A, using the patterned first conductive layer 12 as a mask, an n-type impurity ion such as an arsenic (As) ion is implanted into the p-type well 1 to form the source/drain diffusion layer 6 in the memory cell array region A and also the n-type diffusion layer 9 constituting the protective diode element in the protective diode region B.

Figure 4B:
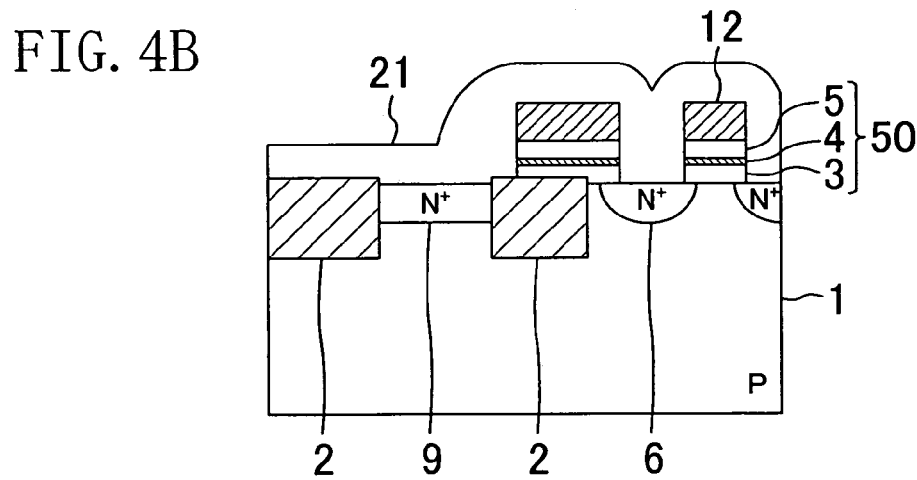

Next, as shown in FIG. 4B, by a low pressure CVD method or the like, the insulating film 21 of silicon oxide is formed on the p-type well 1 to cover the first conductive layer 12 patterned in a rectangular shape.

Figure 4C:
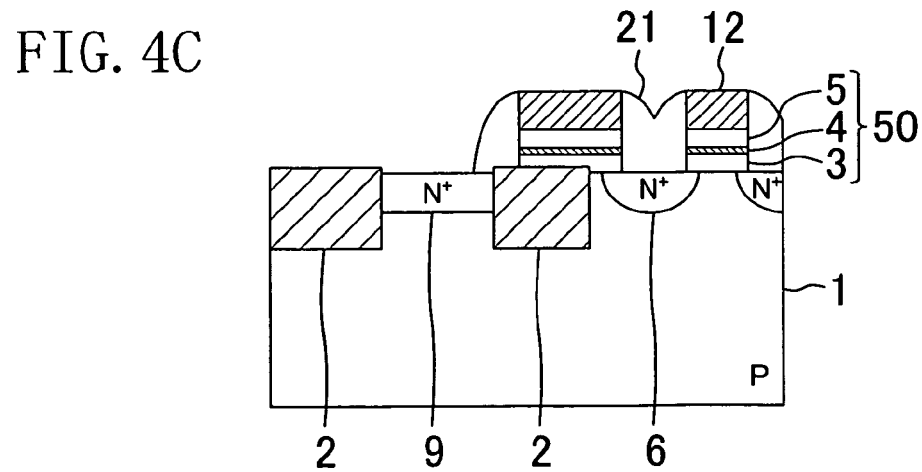

Subsequently, as shown in FIG. 4C, the formed insulating film 21 is subjected to etch back by dry etching to expose the first conductive layer 12 from the insulating film 21 in the memory cell array region A and also the n-type diffusion layer 9 in the protective diode region B.

Figure 5:
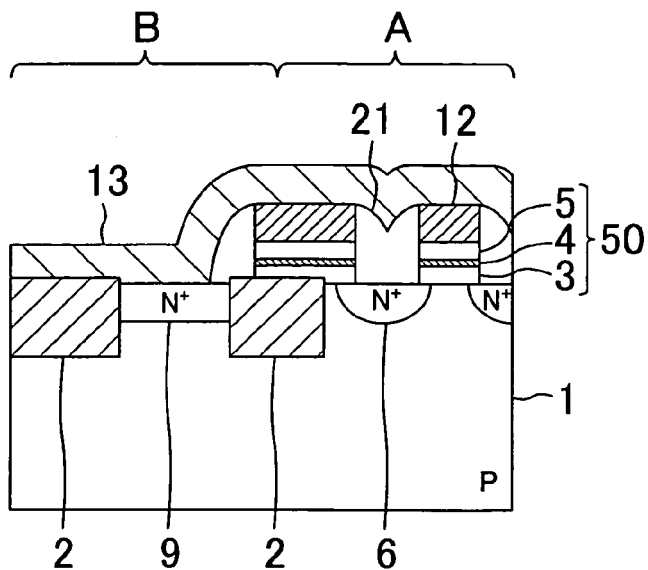
FIG. 5 is a sectional view showing one process step of the method for fabricating a semiconductor memory device according to the first embodiment of the present invention.

As shown in FIG. 5, by a CVD method, the second conductive layer 13 of polycrystalline silicon is formed over the entire surface on the p-type well 1, that is, on the wafer, including the exposed first conductive layer 12 and n-type diffusion layer 9. Subsequently to this, by a lithography method, a photoresist pattern (not shown) with multiple openings extending in the row direction (the direction parallel to the paper) is formed on the second conductive layer 13. Using the formed photoresist pattern as a mask, the second conductive layer 13 and the first conductive layer 12 are dry etched so that the multiple first conductive layers 12 aligned in the row direction are electrically connected to each other, thereby forming the word line. In this etching, at the end of the word line, the second conductive layer 13, the first conductive layer 12, the ONO film 50, and the insulating film 21 are patterned to keep the second conductive layer 13 in the state of direct connection to the n-type diffusion layer 9 exposed in the protective diode region B.

Although not shown, the subsequent formation processes are as follows. An overlying insulating film is formed over the entire surface of the semiconductor substrate including the top of the word line, and then a needed contact hole is formed at a predetermined location in the overlying insulating film. Thereafter, an interconnect layer is formed on the overlying insulating film including the inside of the contact hole.

Figure 6:
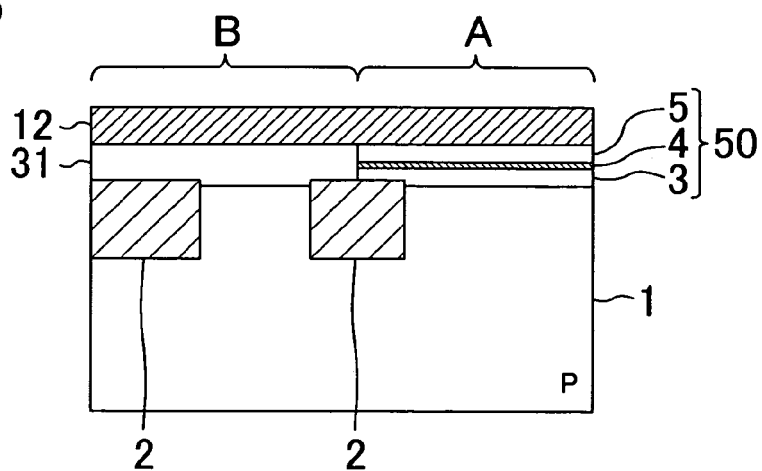
FIG. 6 is a sectional view showing one process step of a first modification of the method for fabricating a semiconductor memory device according to the first embodiment of the present invention.

A first modification of the above fabrication method will now be described. In the above fabrication method, as shown in FIG. 3B, the ONO film 50 composed of the first gate insulating film 3, the charge storage layer 4, and the second gate insulating film 5 is formed in the protective diode region B. In stead of this, in the first modification, an alternative approach as shown in FIG. 6 may be taken in which after formation of the ONO film 50 on at least the entire surface of the p-type well 1, a portion of the formed ONO film 50 contained in the protective diode region B is selectively removed, a third gate insulating film 31 of silicon oxide is then formed on the protective diode region B, and thereafter the first conductive layer 12 is formed. In this formation, removal of the third gate insulating film 31 in the protective diode region B can be simultaneously conducted in the dry etching shown in FIG. 3C or the dry etching of the insulating film 21 shown in FIG. 4B. This avoids the trouble in which the n-type diffusion layer 9 cannot be exposed in the protective diode region B because in etching the ONO film 50 shown in FIG. 3C, the charge storage layer 4 of silicon nitride remains due to insufficient etching and further in subjecting the insulating film 21 to etch back shown in FIG. 4B, the charge storage layer 4 of silicon nitride still remains due to incomplete etching resulting from the difference in etching rate.

Figure 7:
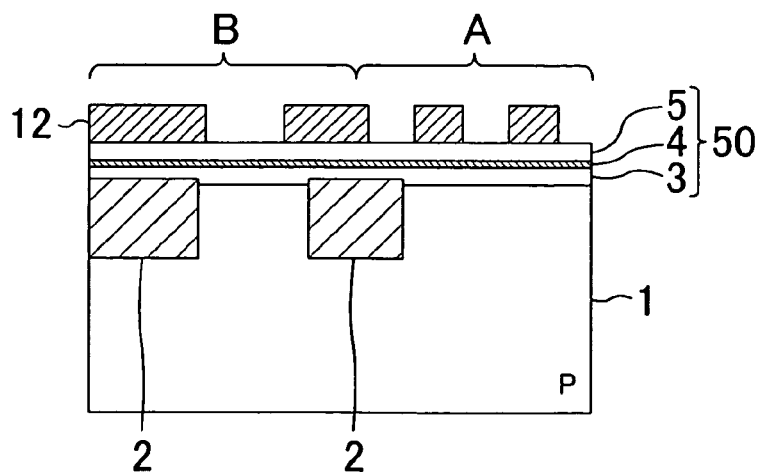
FIG. 7 is a sectional view showing one process step of a second modification of the method for fabricating a semiconductor memory device according to the first embodiment of the present invention.

As a second modification of the above fabrication method, the structure shown in FIG. 3C may be modified to the structure as shown in FIG. 7 in the manner in which the first conductive layer 12 is removed by dry etching and the ONO film 50 remains. In this case, in subjecting the insulating film 21 in the protective diode region B to etch back by dry etching in the step shown in FIG. 4C, the ONO film 50 composed of the first gate insulating film 3, the charge storage layer 4, and the second gate insulating film 5 on the protective diode region B can also be removed to expose the n-type diffusion layer 9 in the protective diode region B.

By employing the fabrication method described above, in the memory cell array region A, the top surface of the first conductive layer 12 can be exposed and simultaneously with this the area on top of the source/drain diffusion layer 6 serving as the diffusion bit line can be filled with the insulating film 21. Furthermore, in the protective diode region B, the insulating film 21 on the n-type diffusion layer 9 type can be removed to expose the n-type diffusion layer 9 type. Moreover, the second conductive layer 13 constituting the word line is deposited to make self-aligned, direct connection between the word line and the n-type diffusion layer 9 type in the protective diode region B, and the word line is also connected directly to the first conductive layer 12.

Therefore, in the memory cell fabrication process shown in FIGS. 4A to 4C, formation of the n-type diffusion layer 9 type and removal of the insulating film 21 on the diffusion layer 9 of the second conductivity type in the protective diode region B can be done together with the associated formation processes of other components, so that addition of new processes for forming the protective diode element are eliminated.

As described above, with the first embodiment, since the end of the second conductive layer 13 constituting the word line is directly connected to the protective diode region B, the protective diode element works in the formation processes subsequent to deposition of the second conductive layer 13 for word line formation. As a result of this, in those formation processes, charge injection into the charge storage layer 4 and stress to the ONO film 50 can be prevented which are caused by electrical charging of the gate electrode and the word line.

Second Embodiment

A second embodiment of the present invention will be described below with reference to the accompanying drawings.

Figure 8:
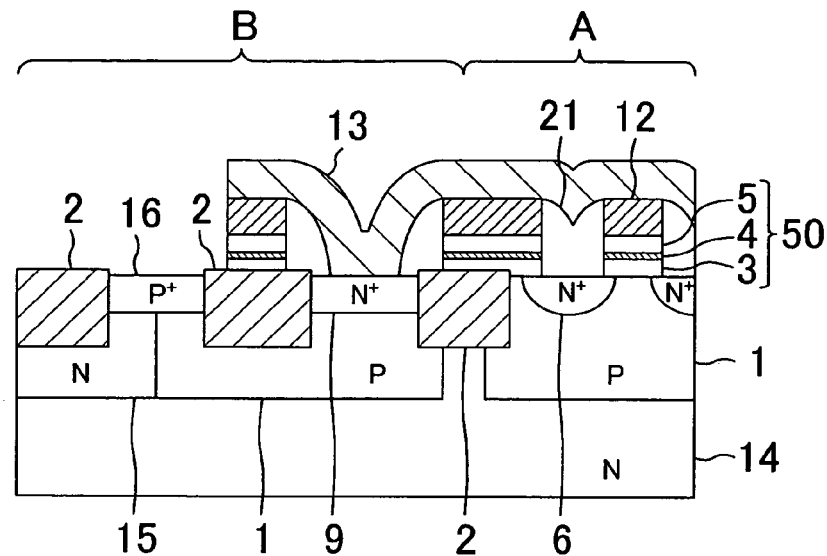
FIG. 8 is a sectional view showing a semiconductor memory device according to a second embodiment of the present invention.

FIG. 8 shows a cross-sectional structure of a semiconductor memory device according to the second embodiment of the present invention. The semiconductor memory device according to the second embodiment is designed by modifying the device specifications and the protective diode element structure of the semiconductor memory device according to the first embodiment. The description of the components shown in FIG. 8 that are the same as those shown in FIG. 1 will be omitted by retaining the same reference numerals.

Referring to FIG. 8, the p-type well 1 is formed in an n-type semiconductor substrate 14 of, for example, n-type silicon to be split into a portion in the memory cell array region A and a portion in the protective diode region B.

In the protective diode region B of the n-type semiconductor substrate 14, an n-type well 15 is formed to come into contact with the p-type well 1 at the side away from the memory cell array region A. A p-type diffusion layer 16 is formed in the upper portion of the junction between the p-type well 1 and the n-type well 15 in the protective diode region B.

Thus, in the protective diode region B, the n-type diffusion layer 9 formed in the upper portion of the p-type well 1, the p-type well 1 and the n-type well 15 adjacent to each other, and the p-type diffusion layer 16 formed to extend across the junction between the p- and n-type wells 1 and 15, which are formed in the n-type semiconductor substrate 14, constitute a protective diode element.

The second conductive layer 13 constituting a word line in the memory cell array region A extends to the protective diode region B, and is directly connected to the n-type diffusion layer 9 which is formed in the upper portion of the p-type well 1 in the protective diode region B.

With the second embodiment, once the second conductive layer 13 serving as the word line is brought into connection to the n-type diffusion layer 9 formed in the upper portion of the p-type well 1 in the protective diode region B, negative charge in the word line (the gate electrode) generated in subsequent formation processes produces a reverse voltage for the pn junction at the junction in the protective diode region B between the n-type well 15 and the p-type diffusion layer 16 formed in the upper portions of the p- and n-type wells 1 and 15 to extend across the junction therebetween. Therefore, by controlling the reverse voltage (breakdown voltage) to about 10 V, the second conductive layer 13 will not have a negative potential with a larger absolute value than the reverse voltage.

Likewise, positive charge in the word line (the gate electrode) generated in the formation processes produces a reverse voltage for the pn junction at the junction in the protective diode region B between the p-type well 1 and the n-type diffusion layer 9 formed in the upper portion of the p-type well 1. Therefore, by controlling the reverse voltage (breakdown voltage) to about 10 V, the word line will not have a high positive potential equal to or higher than the reverse voltage. As a result of this, stress to the ONO film 50 and charge injection into the charge storage layer 4 of the ONO film 50 can be suppressed which are caused by application of a high voltage.

In the first embodiment, when a negative voltage is applied to the word line during device operation, it is impossible to raise the absolute value of the negative potential of the word line. On the other hand, in the second embodiment, even when a negative voltage is applied to the word line, it is possible to raise the absolute value of the negative potential of the word line. Therefore, a device capable of applying a negative voltage to the word line can be realized.

As described above, with the second embodiment, the end of the second conductive layer 13 constituting the word line is directly connected to the protective diode region B. Therefore, the protective diode element works in the formation processes subsequent to deposition of the second conductive layer 13 for word line formation. As a result of this, in those formation processes, charge injection into the charge storage layer 4 and stress to the ONO film 50 can be prevented which are caused by electrical charging of the gate electrode and the word line.

Moreover, even when a negative voltage is applied to the word line, the protective diode element works. Therefore, device operations that apply a negative voltage to the word line can be implemented.

Third Embodiment

A third embodiment of the present invention will be described below with reference to the accompanying drawings.

Figure 9:
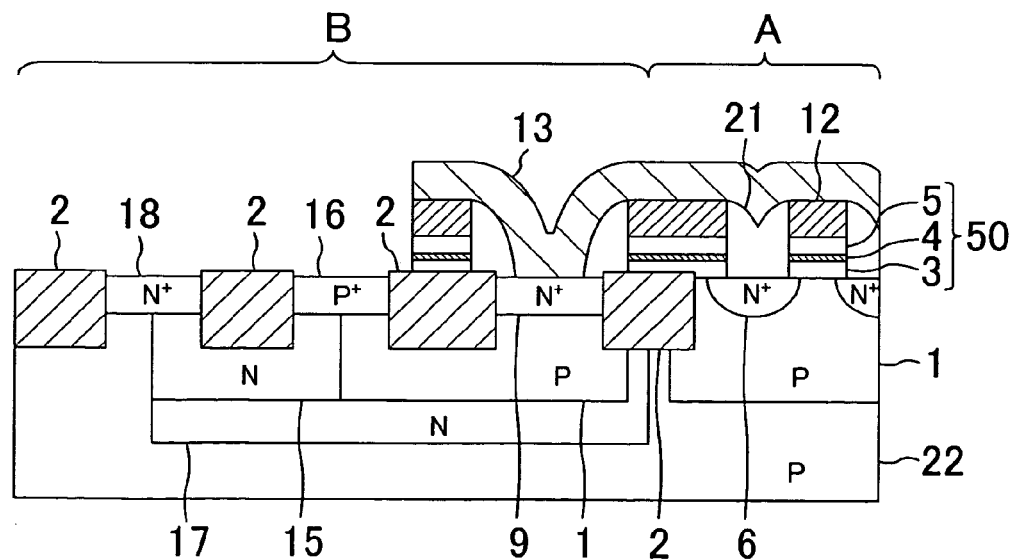
FIG. 9 is a sectional view showing a semiconductor memory device according to a third embodiment of the present invention.

FIG. 9 shows a cross-sectional structure of a semiconductor memory device according to the third embodiment of the present invention. The semiconductor memory device according to the third embodiment is designed as a first modification of the semiconductor memory device according to the second embodiment. The description of the components shown in FIG. 9 that are the same as those shown in FIG. 8 will be omitted by retaining the same reference numerals.

Referring to FIG. 9, the p-type well 1 and the n-type well 15 adjacent to each other in the protective diode region B are formed in the upper portion of a deep n-type well 17 formed in a p-type semiconductor substrate 22 of, for example, p-type silicon. Also, in the protective diode region B, an n-type diffusion layer 18 is formed in the upper portions of the n-type well 15 and the p-type semiconductor substrate 22 to extend across the junction therebetween.

Thus, in the protective diode region B, the n-type diffusion layer 9 formed in the upper portion of the p-type well 1 of the p-type semiconductor substrate 22, the p-type well 1 and the n-type well 15 adjacent to each other, the p-type diffusion layer 16 formed to extend across the p-type well 1 and the n-type well 15, the deep n-type well 17, and the n-type diffusion layer 18 formed to extend across the junction between the n-type well 15 and the p-type semiconductor substrate 22 constitute a protective diode element.

With the third embodiment, once the second conductive layer 13 serving as a word line is brought into connection to the n-type diffusion layer 9 formed in the upper portion of the p-type well 1 in the protective diode region B, negative charge in the word line (the gate electrode) generated in subsequent formation processes produces a reverse voltage for the pn junction at the junction in the protective diode region B between the n-type well 15 and the p-type diffusion layer 16 formed in the upper portions of the p- and n-type wells 1 and 15 to extend across the junction therebetween. Therefore, by controlling the reverse voltage (breakdown voltage) to about 10 V, the second conductive layer 13 will not have a negative potential with a larger absolute value than the reverse voltage.

Likewise, positive charge in the word line (the gate electrode) generated in the formation processes produces a reverse voltage for the pn junction at two points in the protective diode region B: the one point is the junction between the p-type well 1 and the n-type diffusion layer 9 formed in the upper portion of the p-type well 1; and the other point is the junction between the p-type semiconductor substrate 22 and the n-type diffusion layer 18 formed to extend across the junction between the n-type well 15 and the p-type semiconductor substrate 22. Therefore, by controlling the reverse voltage (breakdown voltage) to about 10 V, the word line will not have a positive potential equal to or higher than the reverse voltage. As a result of this, stress to the ONO film 50 and charge injection into the charge storage layer 4 of the ONO film 50 can be suppressed which are caused by application of a high voltage.

Figure 10:
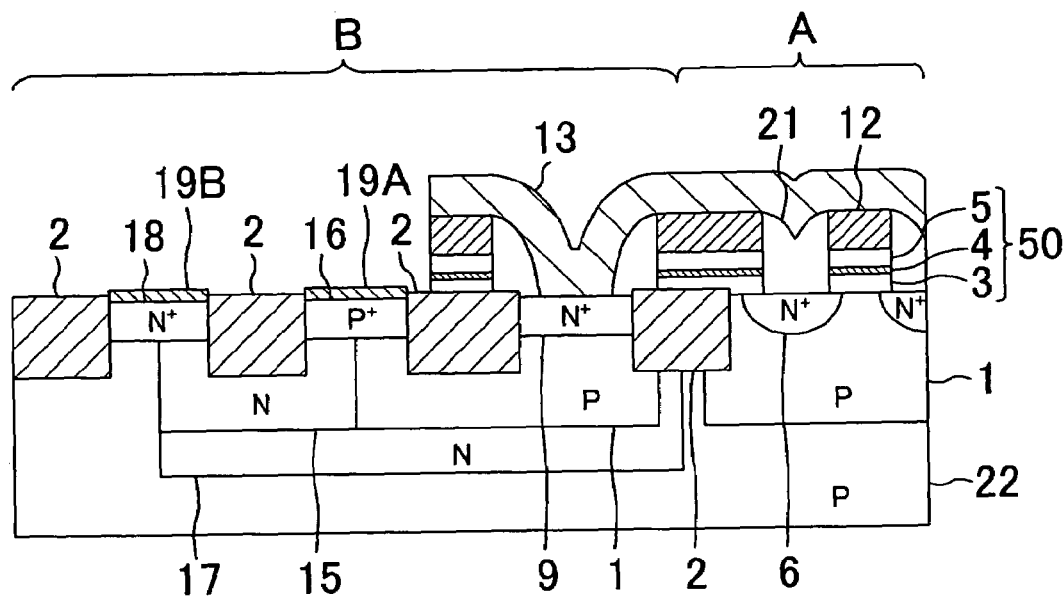
FIG. 10 is a sectional view showing a semiconductor memory device according to another modification of the third embodiment of the present invention.

As another modification, as shown in FIG. 10, in the protective diode region B, a first silicide area 19A and a second silicide area 19B made of a metal compound of metal such as titanium (Ti), cobalt (Co), or nickel (Ni) with silicon may be formed on top of the p-type diffusion layer 16 provided to extend across the p-type well 1 and the n-type well 15 and on top of the n-type diffusion layer 18 provided to extend across the n-type well 15 and the p-type semiconductor substrate 22, respectively. This reduces the resistances of the p-type diffusion layer 16 and the n-type diffusion layer 18. Therefore, if the word line (the gate electrode) is positively or negatively charged in the formation processes to apply to the word line a voltage with an absolute value equal to or higher than that of the reverse voltage of the protective diode element, then a current generated by the applied voltage flows easily into the p-type semiconductor substrate 22. Accordingly, stress to the ONO film 50 and charge injection into the charge storage layer 4 of the ONO film 50 can be suppressed more reliably.

Fourth Embodiment

A fourth embodiment of the present invention will be described below with reference to the accompanying drawings.

Figure 11:
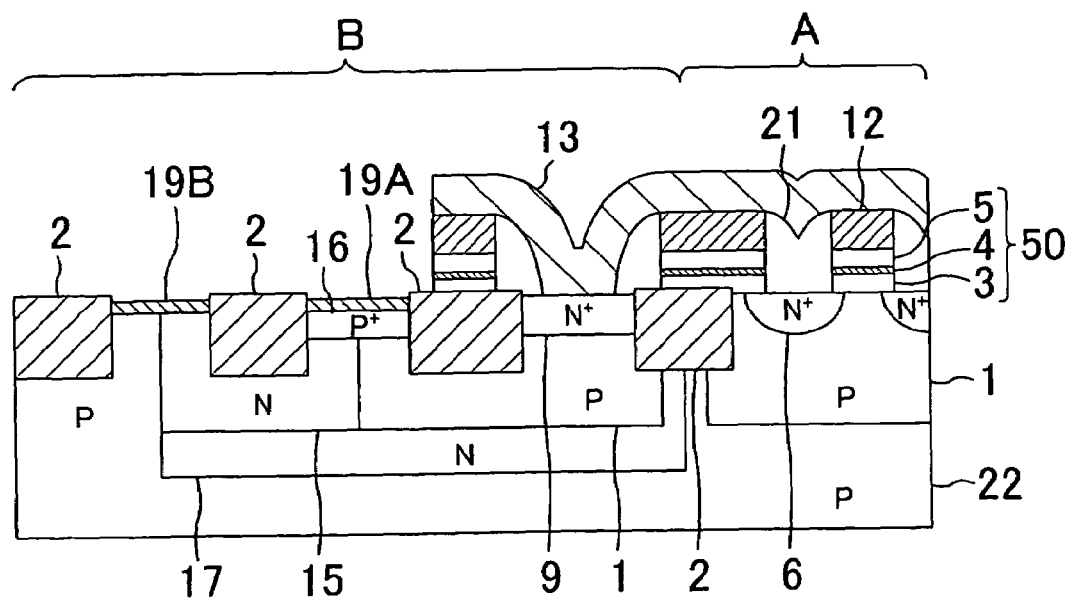
FIG. 11 is a sectional view showing a semiconductor memory device according to a fourth embodiment of the present invention.

FIG. 11 shows a cross-sectional structure of a semiconductor memory device according to the fourth embodiment of the present invention. The semiconductor memory device according to the fourth embodiment is designed as a second modification of the semiconductor memory device according to the second embodiment. The description of the components shown in FIG. 11 that are the same as those shown in FIG. 8 will be omitted by retaining the same reference numerals.

Referring to FIG. 11, the p-type well 1 and the n-type well 15 adjacent to each other in the protective diode region B are formed in the upper portion of the deep n-type well 17 formed in the p-type semiconductor substrate 22 of p-type silicon. Also, in the protective diode region B, the first silicide area 19A and the second silicide area 19B made of Ti silicide or the like are formed on top of the p-type diffusion layer 16 and on top of the junction between the n-type well 15 and the p-type semiconductor substrate 22, respectively.

Thus, in the protective diode region B, the n-type diffusion layer 9 formed in the upper portion of the p-type well 1 of the p-type semiconductor substrate 22, the p-type well 1 and the n-type well 15 adjacent to each other, the p-type diffusion layer 16 and the first silicide area 19A formed to extend across the p-type well 1 and the n-type well 15, the deep n-type well 17, and the second silicide area 19B formed to extend across the junction between the n-type well 15 and the p-type semiconductor substrate 22 constitute a protective diode element.

With the fourth embodiment, once the second conductive layer 13 serving as a word line is brought into connection to the n-type diffusion layer 9 formed in the upper portion of the p-type well 1 in the protective diode region B, negative charge in the word line (the gate electrode) generated in subsequent formation processes produces a reverse voltage for the pn junction at the junction in the protective diode region B between the n-type well 15 and the p-type diffusion layer 16 formed in the upper portions of the p- and n-type wells 1 and 15 to extend across the junction therebetween. Therefore, by controlling the reverse voltage (breakdown voltage) to about 10 V, the second conductive layer 13 will not have a negative potential with a larger absolute value than the reverse voltage.

Likewise, positive charge in the word line (the gate electrode) generated in the formation processes produces a reverse voltage for the pn junction at the junction in the protective diode region B between the p-type well 1 and the n-type diffusion layer 9 formed in the upper portion of the p-type well 1. Therefore, by controlling the reverse voltage (breakdown voltage) to about 10 V, the word line will not have a high positive potential equal to or higher than the reverse voltage. As a result of this, stress to the ONO film 50 and charge injection into the charge storage layer 4 of the ONO film 50 can be suppressed which are caused by application of a high voltage.

Moreover, comparison is made between the third and fourth embodiments in the case of applying a high positive voltage to the word line. For the fourth embodiment, a reverse voltage is placed on only one point by the time a current generated by the high voltage flows into the p-type semiconductor substrate 22. Thus, this embodiment exerts the effect of facilitating the control of breakdown voltage and stabilizing device operations.

Fifth Embodiment

A fifth embodiment of the present invention will be described below with reference to the accompanying drawings.

Figure 12:
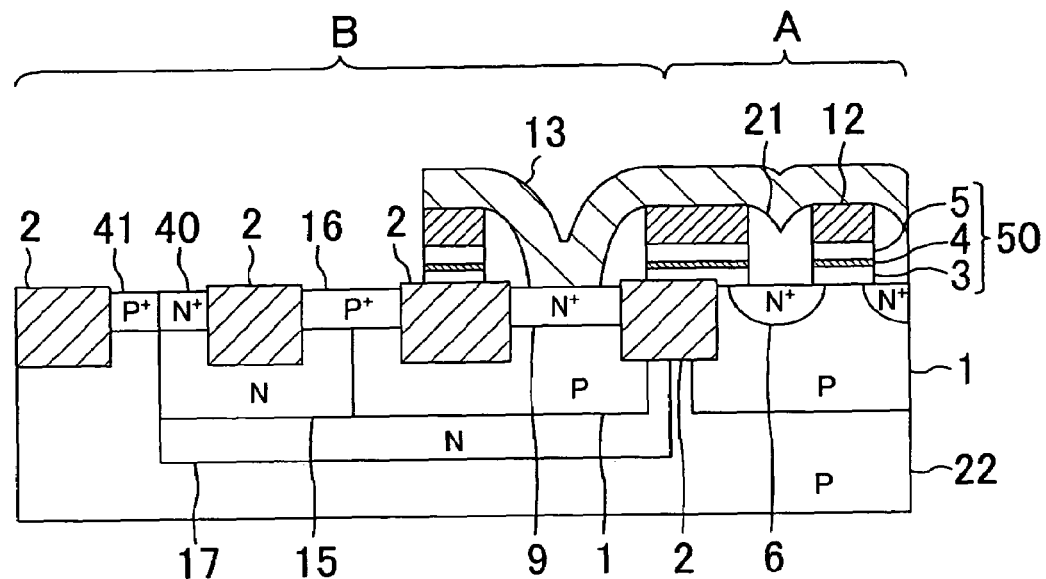
FIG. 12 is a sectional view showing a semiconductor memory device according to a fifth embodiment of the present invention.

FIG. 12 shows a cross-sectional structure of a semiconductor memory device according to the fifth embodiment of the present invention. The semiconductor memory device according to the fifth embodiment is designed as a first modification of the semiconductor memory device according to the third embodiment. The description of the components shown in FIG. 12 that are the same as those shown in FIG. 9 will be omitted by retaining the same reference numerals.

Referring to FIG. 12, in the protective diode region B, an n-type diffusion layer 40 is formed in an upper end portion of the n-type well 15 away from the p-type diffusion layer 16, and a p-type diffusion layer 41 is formed in an upper end portion of the p-type semiconductor substrate 22 located on the side of the n-type diffusion layer 40 away from the p-type diffusion layer 16. In this structure, the junction between the n-type diffusion layer 40 and the p-type diffusion layer 41 is positioned at almost the same location as the junction between the n-type well 15 and the p-type semiconductor substrate 22.

Thus, in the protective diode region B, the n-type diffusion layer 9 formed in the upper portion of the p-type well 1 of the p-type semiconductor substrate 22, the p-type well 1 and the n-type well 15 adjacent to each other, the p-type diffusion layer 16 formed to extend across the p-type well 1 and the n-type well 15, the deep n-type well 17, the n-type diffusion layer 40 formed in the upper end portion of the n-type well 15 away from the p-type diffusion layer 16, and the p-type diffusion layer 41 formed in the upper end portion of the p-type semiconductor substrate 22 located on the side of the n-type diffusion layer 40 away from the p-type diffusion layer 16 constitute a protective diode element.

With the fifth embodiment, once the second conductive layer 13 serving as a word line is brought into connection to the n-type diffusion layer 9 formed in the upper portion of the p-type well 1 in the protective diode region B, negative charge in the word line (the gate electrode) generated in subsequent formation processes produces a reverse voltage for the pn junction at the junction in the protective diode region B between the n-type well 15 and the p-type diffusion layer 16 formed in the upper portions of the p- and n-type wells 1 and 15 to extend across the junction therebetween. Therefore, by controlling the reverse voltage (breakdown voltage) to about 10 V, the second conductive layer 13 will not have a negative potential with a larger absolute value than the reverse voltage.

Likewise, positive charge in the word line (the gate electrode) generated in the formation processes produces a reverse voltage for the pn junction at two points in the protective diode region B: the one point is the junction between the p-type well 1 and the n-type diffusion layer 9 formed in the upper portion of the p-type well 1; and the other point is the junction between the n-type diffusion layer 40 formed in the upper portion of the n-type well 15 and the p-type diffusion layer 41 formed in the upper portion of the p-type semiconductor substrate 22. Therefore, by controlling the reverse voltage (breakdown voltage) to about 10 V, the word line will not have a positive potential equal to or higher than the reverse voltage. As a result of this, stress to the ONO film 50 and charge injection into the charge storage layer 4 of the ONO film 50 can be suppressed which are caused by application of a high voltage.

In the case of the semiconductor memory device shown in FIG. 9 according to the third embodiment, when in the pn junction between the n-type diffusion layer 18 and the p-type semiconductor substrate 22, a high-temperature thermal treatment is performed after formation of the n-type diffusion layer 18 to diffuse the n-type impurity from the n-type diffusion layer 18, the p-type impurity concentration around the pn junction will be lowered. This may make it difficult to control the breakdown voltage to a value as low as about 10 V. In such situation, it is assumed that during a certain formation process, the word line is positively charged and thus the pn junction between the p-type well 1 and the n-type diffusion layer 9 within the p-type well 1 is clamped at about 10 V. However, the pn junction between the n-type diffusion layer 18 and the p-type semiconductor substrate 22 is not clamped because of its high breakdown voltage, so that charge is given to the p-type well 1. This may result in a rise in the potential of the word line to 10 V or higher.

In the fifth embodiment, the p-type diffusion layer 41 formed in the p-type semiconductor substrate 22 and having the junction to the n-type diffusion layer 40 can have a higher impurity concentration than the p-type well 1. This avoids the trouble described above.

To be more specific, when the impurity concentration of the p-type diffusion layer 41 is made higher than that of the p-type well 1, the breakdown voltage of the pn junction between the n-type diffusion layer 40 and the p-type diffusion layer 41 can be set significantly lower than the breakdown voltage of the pn junction between the n-type diffusion layer 18 and the p-type semiconductor substrate 22 according to the third embodiment. This provides a protective diode element with a practical breakdown voltage that will not cause the trouble described above. Moreover, since the breakdown voltage of the pn junction between the n-type diffusion layer 40 and the p-type diffusion layer 41 can be set at a significantly low value, the reverse voltage (breakdown voltage) produced in the case of positive charging of the word line can be controlled only by the breakdown voltage of the pn junction between the p-type well 1 and the n-type diffusion layer 9 formed in the p-type well 1.

Figure 13:
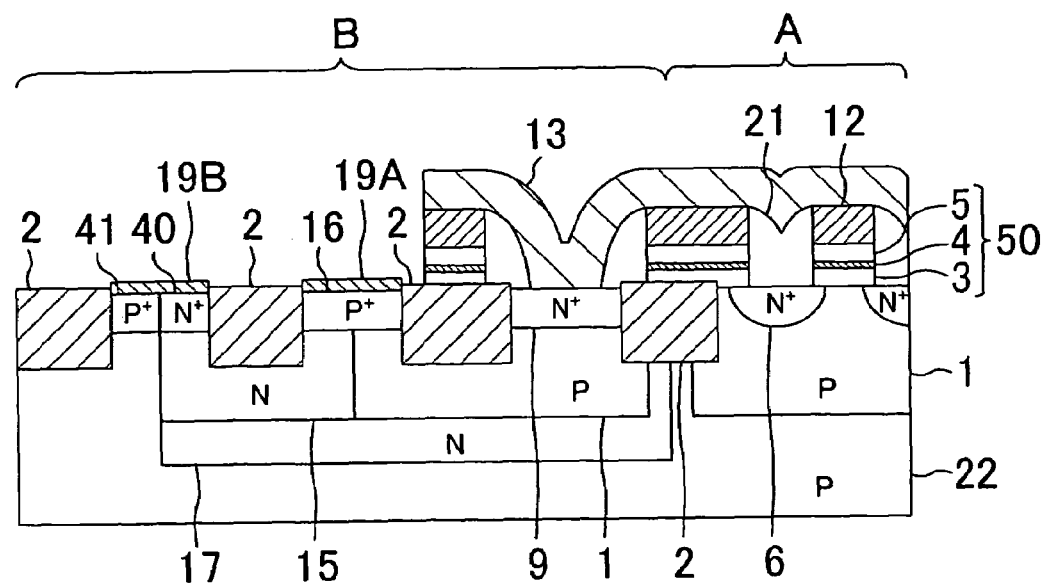
FIG. 13 is a sectional view showing a semiconductor memory device according to one modification of the fifth embodiment of the present invention.

As one modification, as shown in FIG. 13, in the protective diode region B, the first silicide area 19A and the second silicide area 19B as in the case of the fourth embodiment may be formed on top of the p-type diffusion layer 16 provided to extend across the p-type well 1 and the n-type well 15 and on top of the n-type diffusion layer 40 and the p-type diffusion layer 41 adjacent to each other, respectively. With this structure, control of the reverse voltage (breakdown voltage) produced in the case of positive charging of the word line is further facilitated only by the breakdown voltage of the pn junction between the p-type well 1 and the n-type diffusion layer 9 within the p-type well 1, and in addition device operations are stabilized.

Sixth Embodiment

A sixth embodiment of the present invention will be described below with reference to the accompanying drawings.

Figure 14:
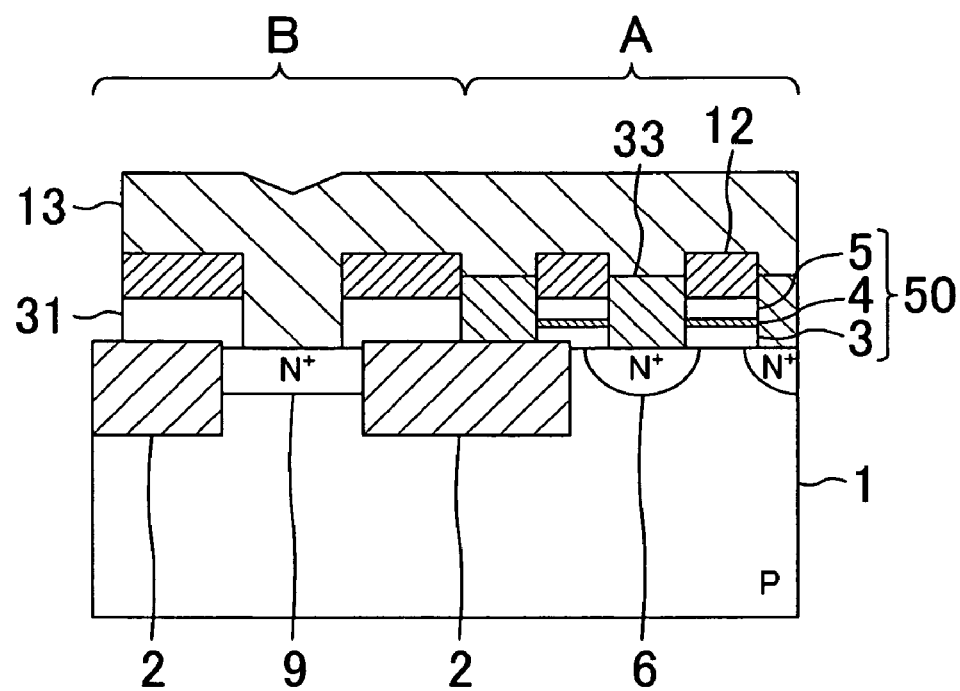
FIG. 14 is a sectional view showing a semiconductor memory device according to a sixth embodiment of the present invention.

FIG. 14 shows a cross-sectional structure of a semiconductor memory device according to the sixth embodiment of the present invention. The description of the components shown in FIG. 14 that are the same as those shown in FIG. 1 will be omitted by retaining the same reference numerals. The semiconductor memory device according to the sixth embodiment has the structure that enables a finer structure than the semiconductor memory devices according to the first to fifth embodiments.

As illustrated in FIG. 4C, in the method for fabricating a semiconductor memory device according to the first embodiment, the insulating film 21 covering the p-type well 1 is subject to etch back by dry etching to expose the first conductive layer 12 in the memory cell array region A and also the n-type diffusion layer 9 in the protective diode region B. In this step, in the memory cell array region A, the space between the adjacent first conductive layers 12 constituting the memory cell should be filled with the insulating film 21. Provided that the space between the first conductive layers 12 is not filled with the insulating film 21, the second conductive layer 13 may be electrically connected to the source/drain diffusion layer 6. In this possible case, the memory cell cannot be operated as intended. Typically, for the fabrication method including the step in FIG. 4C, the insulating film 21 is formed by a low pressure CVD method. However, as the structure of the device is finer, the distance between the memory cells becomes narrower and in turn it may be impossible to completely fill the space between the first conductive layers 12 by the low pressure CVD method.

Furthermore, if the structure in the step shown in FIG. 4C is in the state in which the insulating film 21 remains on the surface of the n-type diffusion layer 9 in the protective diode region B, the second conductive layer 13 is not connected to the n-type diffusion layer 9. As a result, the protective diode element may fail to work. As the structure of the device is finer, reduction in the size of the protective diode region B is demanded. Thus, when the insulating film 21 is deposited by a low pressure CVD method and then the insulating film 21 is subjected to etch back by etching, a sidewall of the insulating film 21 formed on the side surfaces of the ONO film 50 and the first conductive layer 12 may cover the n-type diffusion layer 9 to cause a possible situation as mentioned above in which the second conductive layer 13 cannot be connected to the n-type diffusion layer 9.

To avoid such a problem, in the sixth embodiment, description will be made of a semiconductor memory device capable of having the characteristics of the present invention and also having a finer structure, and of its fabrication method.

Referring to FIG. 14, the source/drain diffusion layer 6 is formed in an area of the upper portion of the p-type well 1 which is located between the ONO films 50 extending in the column direction. Between the source/drain diffusion layer 6 and the second conductive layer 13, an insulating film 33 overlying the source/drain diffusion layer (abbreviated hereinafter to an insulating film 33) is formed which has a planarized upper surface. As a characteristic of the sixth embodiment, the insulating film 33 is formed only in the memory cell array region A, and not formed in the protective diode region B.

Like the first embodiment, in the protective diode region B adjacent to the memory cell array region A, the n-type diffusion layer 9 is formed in the upper region of the p-type well 1, and the n-type diffusion layer 9 and the p-type well 1 constitute a protective diode element. On the side end of the n-type diffusion layer 9, the third gate insulating film 31 of silicon oxide is formed instead of the ONO film 50 composed of the first gate insulating film 3, the charge storage layer 4, and the second gate insulating film.

In the memory cell array region A, the second conductive layer 13 of, for example, polycrystalline silicon is formed which collectively connects gate electrodes of multiple memory cells aligned in the row direction of the memory cell array and which constitutes a word line and a gate electrode. The second conductive layer 13 extends to the protective diode region B and is directly connected to the n-type diffusion layer 9 in the protective diode region B.

With the sixth embodiment, like the first embodiment, stress to the ONO film 50 or charge injection into the charge storage layer 4 of the ONO film 50 can be suppressed in the formation processes. In addition to this, no insulating film in a sidewall shape is formed on the n-type diffusion layer 9 in the protective diode region B, so that the size of the protective diode region B can be reduced. This enables miniaturization of the semiconductor memory device.

Hereinafter, a fabrication method of the semiconductor memory device constructed as shown above will be described with reference to the accompanying drawings.

Figure 15A:
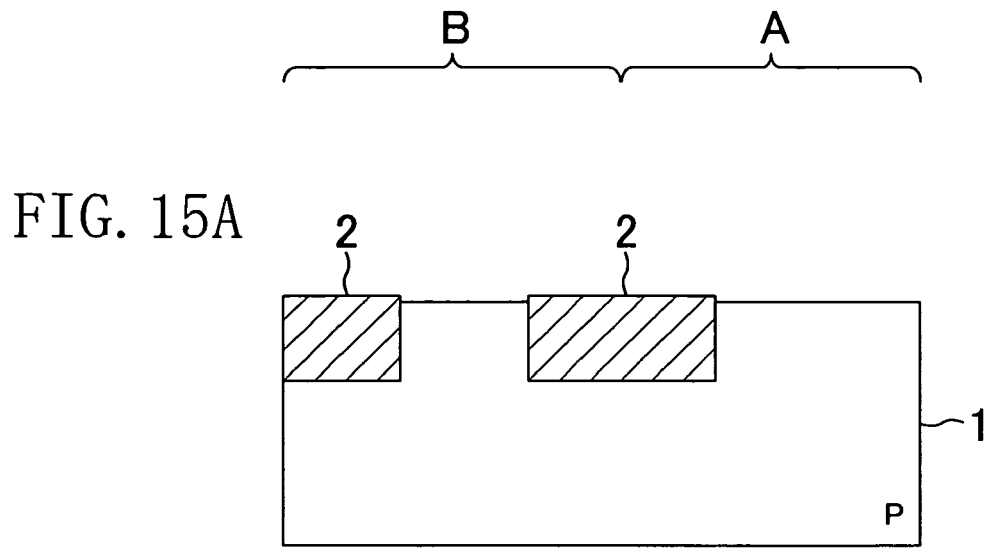
FIGS. 15A to 15C are sectional views showing a method for fabricating a semiconductor memory device according to the sixth embodiment of the present invention in the order of its fabrication process steps.

Referring to FIG. 15A, first, an isolation insulating film 2 of an STI structure is selectively formed in the upper portion of the p-type well (or a p-type semiconductor substrate) 1.

Figure 15B:
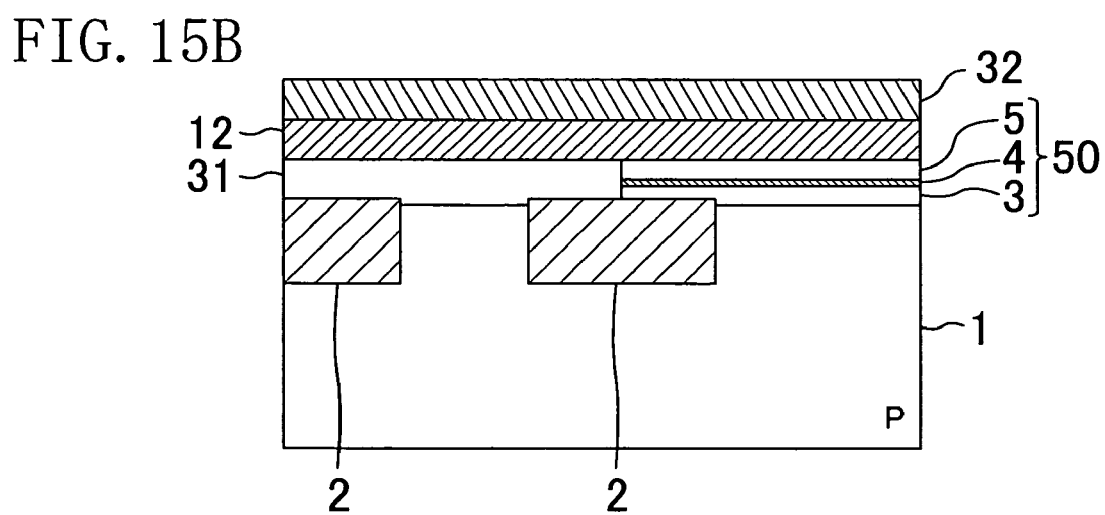

Next, as shown in FIG. 15B, by a CVD method or the like, the first gate insulating film 3, the charge storage layer 4, and the second gate insulating film 5 are sequentially formed on the entire surface of the p-type well 1 including the isolation insulating film 2, thereby forming the ONO film 50. Thereafter, a portion of the formed ONO film 50 contained in the protective diode region B is selectively removed. Then, the third gate insulating film 31 is selectively formed on the exposed p-type well 1 and the isolation insulating film 2 in the protective diode region B. Then, the first conductive layer 12 of polycrystalline silicon and an insulating film 32 for gate electrode formation made of silicon nitride are sequentially formed over the entire surface in the memory cell array region A and the protective diode region B.

Figure 15C:
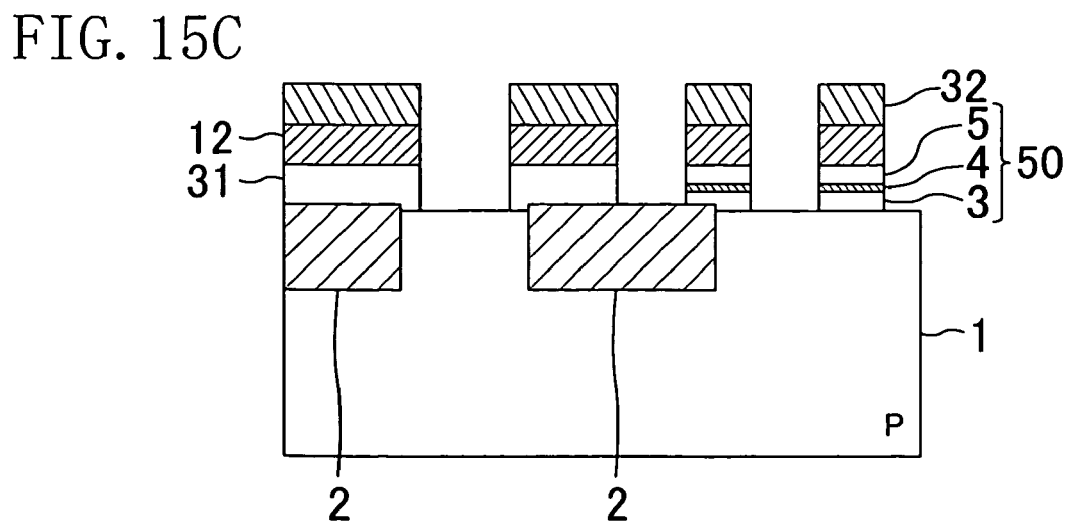

Subsequently, as shown in FIG. 15C, by a lithography method and an etching method, in the memory cell array region A, the insulating film 32 for gate electrode formation is patterned in rectangular shapes extending in the column direction, while in the protective diode region B, a portion of the insulating film 32 for gate electrode formation located above the p-type well 1 is removed. Thereafter, using the patterned insulating film 32 for gate electrode formation as a mask, the first conductive layer 12, the underlying ONO film 50 composed of the first gate insulating film 3, the charge storage layer 4, and the second gate insulating film 5, and the third gate insulating film 31 are patterned by dry etching.

As shown in FIG. 16A, using the insulating film 32 for gate electrode formation as a mask, an n-type impurity such as arsenic (As) is implanted into the p-type well 1 to form the n-type source/drain region 6 in the memory cell array region A and the n-type diffusion layer 9 constituting the protective diode element in the protective diode region B.

Next, as shown in FIG. 16B, by a high density plasma CVD method or the like, the insulating film 33 of silicon oxide is formed over the entire surface on the p-type well 1 to cover the insulating film 32 for gate electrode formation.

Subsequently, as shown in FIG. 16C, by a chemical mechanical polishing (CMP) method, the insulating film 33 is polished to expose the insulating film 32 for gate electrode formation, and then the insulating film 32 for gate electrode formation is removed by wet etching with hot phosphoric acid or the like.

As shown in FIG. 16D, by a lithography method, a first photoresist pattern 34 is formed which has an opening above the n-type diffusion layer 9 in the protective diode region B. Subsequently, using the formed first photoresist pattern 34 as a mask, the insulating film 33 in the protective diode region B is dry etched to expose the n-type diffusion layer 9 in the protective diode region B.

Figure 17A:
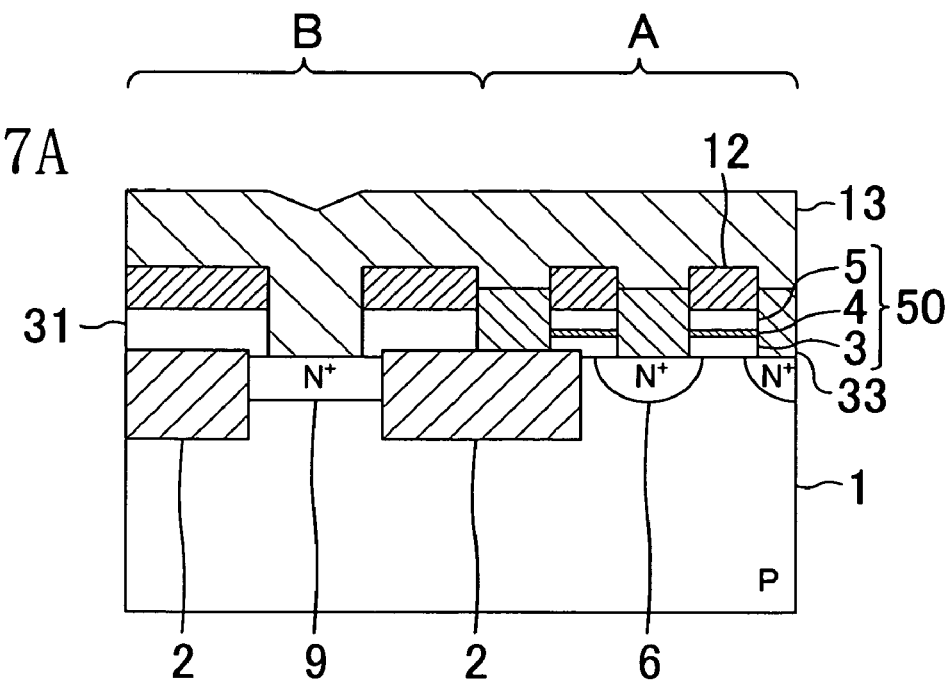
FIGS. 17A and 17B are sectional views showing the method for fabricating a semiconductor memory device according to the sixth embodiment of the present invention in the order of its fabrication process steps.

Next, as shown in FIG. 17A, the first photoresist pattern 34 is removed, and then by a CVD method, the second conductive layer 13 of polycrystalline silicon is deposited over the entire surface on the p-type well 1, that is, on the wafer, including the exposed first conductive layer 12 and n-type diffusion layer 9. Thereby, in the protective diode region B, the second conductive layer 13 is brought into direct connection to the n-type diffusion layer 9.

Figure 17B:
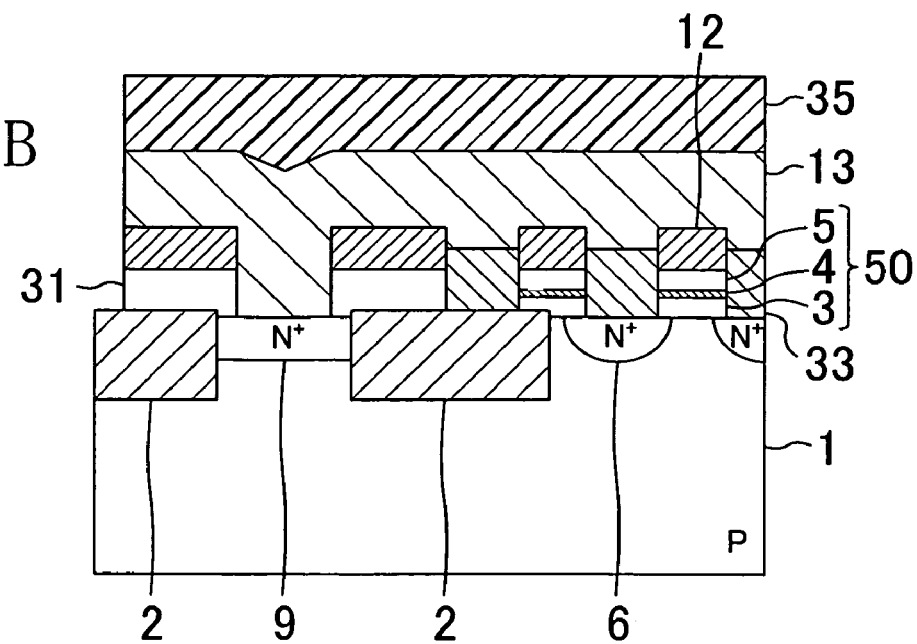

Then, as shown in FIG. 17B, on the second conductive layer 13, the second photoresist pattern 35 is formed which has a pattern with multiple openings extending in the row direction. Subsequently, using the formed second photoresist pattern 35 as a mask, the second conductive layer 13 and the first conductive layer 12 are dry etched so that the first conductive layers 12 aligned in the row direction are electrically connected to each other, thereby forming the word line. In this etching, at the end of the word line, the second conductive layer 13, the first conductive layer 12, the ONO film 50, and the insulating film 33 are patterned to keep the second conductive layer 13 in the state of direct connection to the n-type diffusion layer 9 exposed in the protective diode region B.

Figure 18:
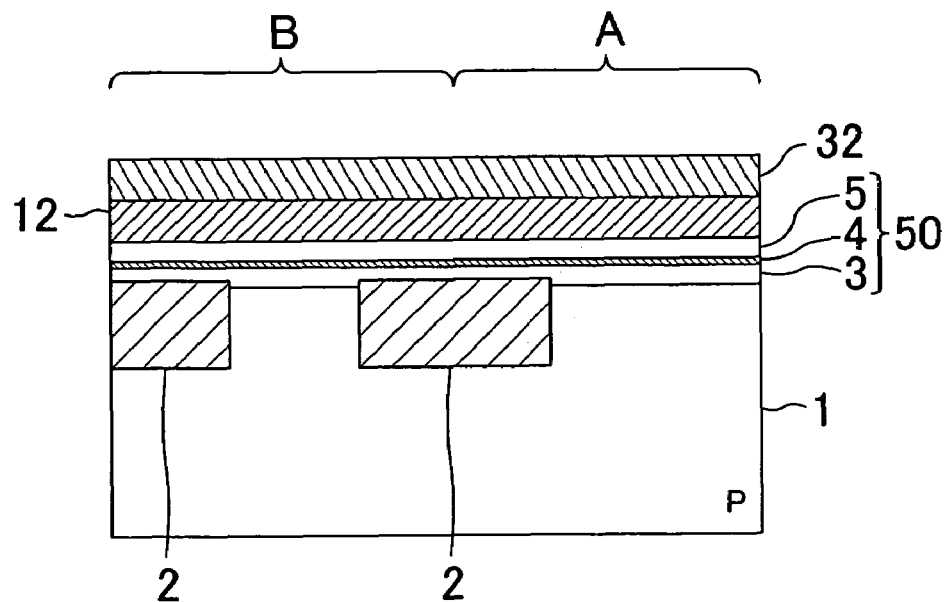
FIG. 18 is a sectional view showing one process step of a first modification of the method for fabricating a semiconductor memory device according to the sixth embodiment of the present invention.

A first modification of the above fabrication method will now be described. In the above fabrication method, in the step shown in FIG. 15B, the third gate insulating film is formed in the protective diode region B. In stead of this, in the first modification, an alternative approach may be taken in which the ONO film 50 is not removed from the protective diode region B as shown in FIG. 18 and with the ONO film 50 still remaining, the first conductive layer 12 and the insulating film 32 for gate electrode formation are formed. For the first modification, the ONO film 50 remaining in the protective diode region B is removed at the same time as the dry etching in the step shown in FIG. 15C or the dry etching in the step shown in FIG. 16D, whereby the n-type diffusion layer 9 in the protective diode region B can be exposed.

Figure 19:
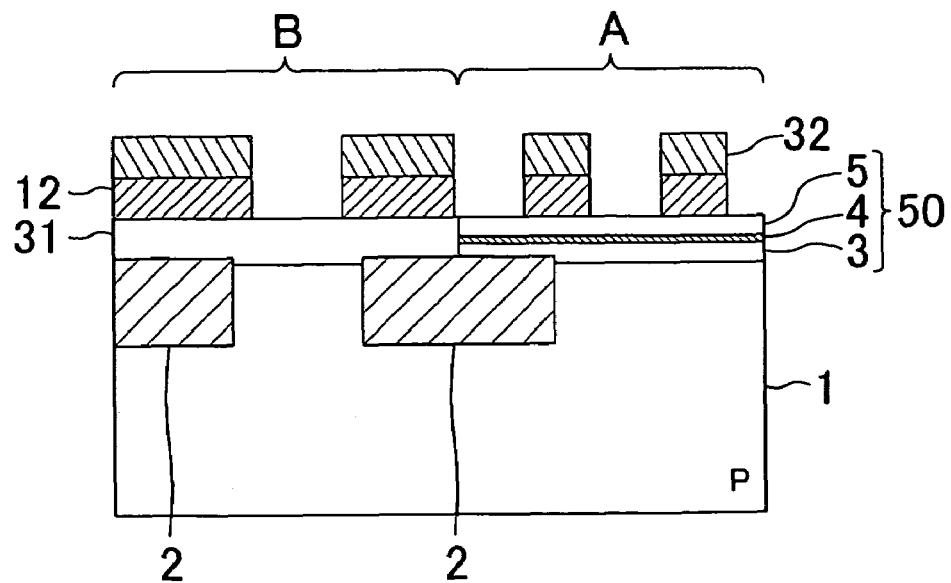
FIG. 19 is a sectional view showing one process step of a second modification of the method for fabricating a semiconductor memory device according to the sixth embodiment of the present invention.

As a second modification of the above fabrication method, another approach as shown in FIG. 19 may be taken in which in the step shown in FIG. 15C, only the first conductive layer 12 is removed by dry etching to form the memory cell array region A with the ONO film 50 remaining and the protective diode region B with the third gate insulating film 31 remaining. For the second modification, in the step shown in FIG. 16D, in removing the insulating film 33 in the protective diode region B by dry etching, the third gate insulating film 31 can also be removed continuously to expose the n-type diffusion layer 9 in the protective diode region B.

In the sixth embodiment, a high density plasma CVD method is employed in the step shown in FIG. 16B to ensure a more reliable filling of an area having a high aspect ratio with the insulating film 33 than the case of employing a low pressure CVD method. In the case where an insulating film is formed by a high density plasma CVD method, however, the insulating film immediately after completion of the film formation does not have a shape reflecting the shape of the underlying film as in the case of the film formed by a low pressure CVD method. That is to say, the thickness of the insulating film 33 formed on the insulating film 32 for gate electrode formation is smaller than the thicknesses of portions of the insulating film 33 formed between the memory cells and on the p-type well 1 in the protective diode region B.

Therefore, if attempts as shown in the step in FIG. 4C in the first embodiment are simultaneously made to remove the insulating film 33 formed in the protective diode region B by etching and to expose the first conductive layer 12 in the memory cell array region A, the insulating film 33 formed between the memory cells is also removed at the same time.

To deal with this trouble, in the sixth embodiment, as shown in FIG. 16C, the insulating film 33 on the first conductive layer 12 is removed by a CMP method. In a subsequent step, as shown in FIG. 16D, by the etching using the second photoresist pattern 34, the insulating film 33 in the protective diode region B can be removed reliably with the insulating film 33 between the memory cells remaining in the memory cell array region A.

As described above, with the method for fabricating a semiconductor memory device according to the sixth embodiment, the second conductive layer 13 constituting-the word line is directly connected to the n-type diffusion layer 9 constituting the protective diode element as shown in FIG. 14. Therefore, the protective diode element works in the formation processes subsequent to deposition of the second conductive layer 13 for word line formation. As a result of this, after deposition of the second conductive layer 13, stress to the ONO film 50 can be suppressed. Furthermore, the distance between the memory cells can be reduced and also the size of the protective diode region B can be reduced.

Note that in the sixth embodiment, the structure of the protective diode region B may be the same as the structure of any of the second to fifth embodiments. The same holds true for the seventh and eighth embodiments that follow.

Seventh Embodiment

A seventh embodiment of the present invention will be described below with reference to the accompanying drawings.

Figure 20:
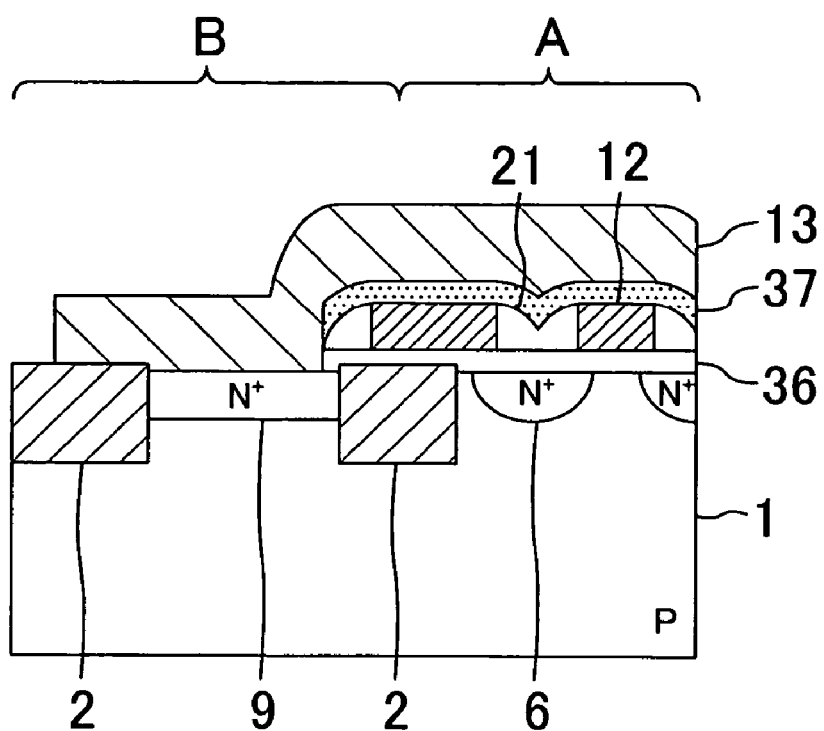
FIG. 20 is a sectional view showing a semiconductor memory device according to a seventh embodiment of the present invention.

FIG. 20 shows a cross-sectional structure of a semiconductor memory device having a floating gate electrode-type memory cell according to the seventh embodiment of the present invention. The description of the components shown in FIG. 20 that are the same as those shown in FIG. 1 will be omitted by retaining the same reference numerals.

In the first to sixth embodiments described above, description has been made of, as a memory cell, the MONOS-type memory cell using a silicon nitride film for the charge storage layer 4 constituting the gate insulating film 50. However, the present invention is not limited to the MONOS-type memory cell, and is applicable also to a floating gate electrode-type memory cell using, for example, polycrystalline silicon for the charge storage layer. Hence, in the seventh embodiment, description will be made of a semiconductor memory device with the floating gate electrode-type memory cell and its fabrication method.

Referring to FIG. 20, in the memory cell array region A, a floating gate electrode-type memory cell has a tunnel oxide film 36 as a tunnel insulating film formed between the p-type well 1 and the first conductive layer 12, and a coupling capacitor insulating film 37 formed between the first conductive layer 12 and the second conductive layer 13. Thus, the first conductive layer 12 is capacitively coupled through the coupling capacitor insulating film 37 to the second conductive layer 13, whereby the first conductive layer 12 functions as a floating gate electrode.

Like the first to sixth embodiments, in the protective diode region B, the p-type well 1 and the n-type diffusion layer 9 formed in the upper portion of the p-type well 1 constitute a protective diode element. In this structure, in the memory cell array region A, the word line composed of the second conductive layer 13 is formed which collectively connects gate electrodes of multiple memory cells aligned in the row direction of the memory cell array. The second conductive layer 13 serving as the word line extends to the protective diode region B, and is directly connected to the n-type diffusion layer 9 formed in the upper portion of the p-type well 1 in the protective diode region B.

With the seventh embodiment, like the first to sixth embodiments, stress to the gate insulating film (the tunnel oxide film 36) can be suppressed in the formation processes.

Hereinafter, a fabrication method of the semiconductor memory device constructed as shown above will be described with reference to the accompanying drawings.

Figure 21A:
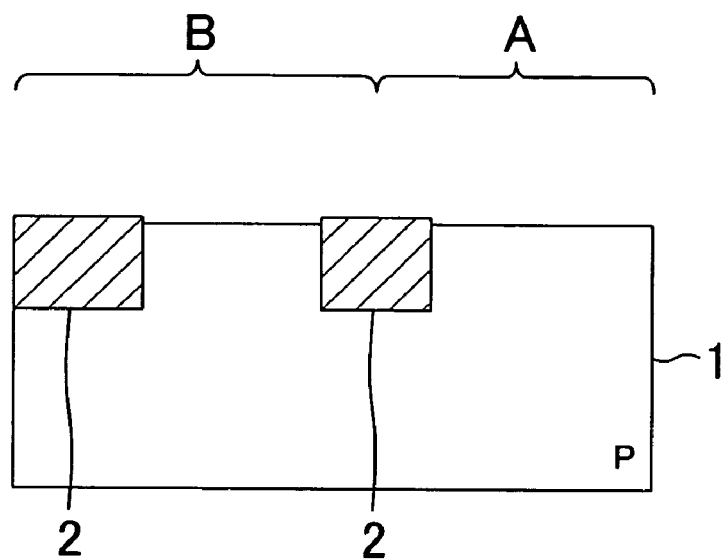
FIGS. 21A to 21C are sectional views showing a method for fabricating a semiconductor memory device according to the seventh embodiment of the present invention in the order of its fabrication process steps.

Referring to FIG. 21A, first, an isolation insulating film 2 of an STI structure is selectively formed in the upper portion of the p-type well (or a p-type semiconductor substrate) 1.

Figure 21B:
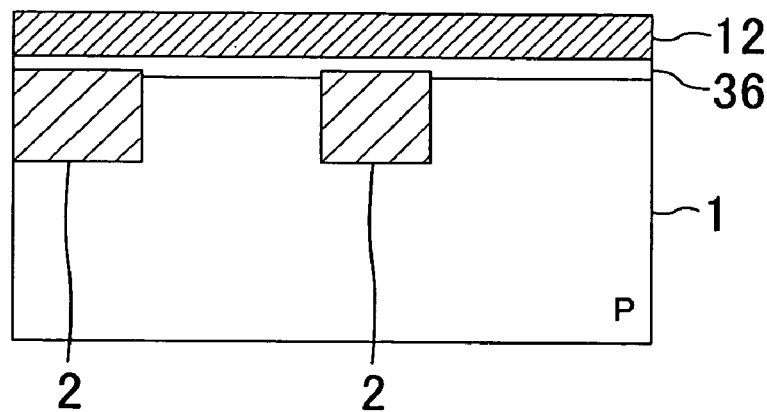

Next, as shown in FIG. 21B, for example, by a thermal oxidation method or a CVD method, the tunnel oxide film 36 of silicon oxide is formed on the entire surface of the p-type well 1 including the isolation insulating film 2. Thereafter, on the formed tunnel oxide film 36, the first conductive layer 12 of polycrystalline silicon is formed by a CVD method.

Figure 21C:
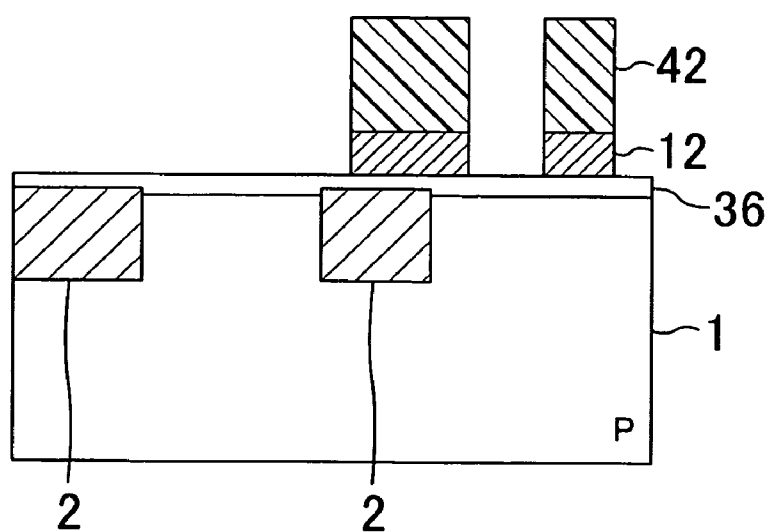

Subsequently, as shown in FIG. 21C, using a first photoresist pattern 42 formed by a lithography method, by dry etching, the first conductive layer 12 formed in the memory cell array region A is patterned in rectangular shapes extending in the column direction, and concurrently at least a portion of the first conductive layer 12 in the protective diode region B is removed.

Figure 22A:
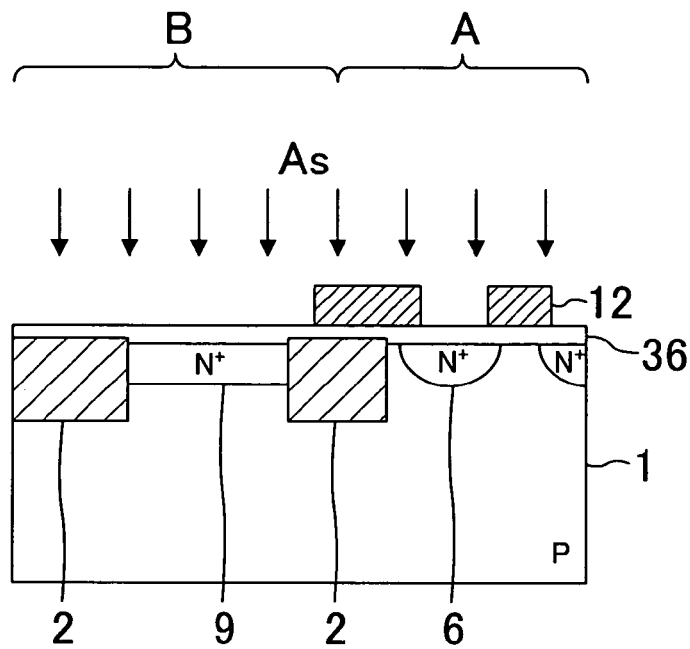
FIGS. 22A to 22C are sectional views showing the method for fabricating a semiconductor memory device according to the seventh embodiment of the present invention in the order of its fabrication process steps.

As shown in FIG. 22A, after removal of the first photoresist pattern 42, an n-type impurity such as arsenic (As) is implanted into the p-type well 1 using the first conductive layer 12 as a mask. Thereby, the n-type source/drain region 6 is formed in the memory cell array region A, and the n-type diffusion layer 9 constituting the protective diode element is formed in the protective diode region B.

Figure 22B:
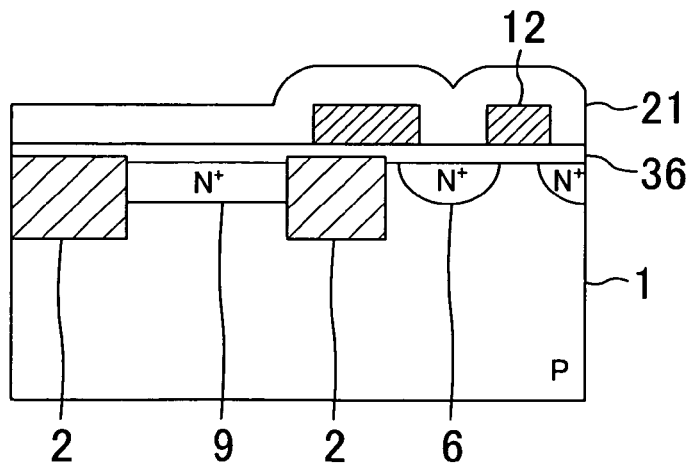

Next, as shown in FIG. 22B, by a low pressure CVD method or the like, the insulating film 21 of silicon oxide is formed on the tunnel oxide film 36 to cover the first conductive layer 12 patterned in a rectangular shape.

Figure 22C:
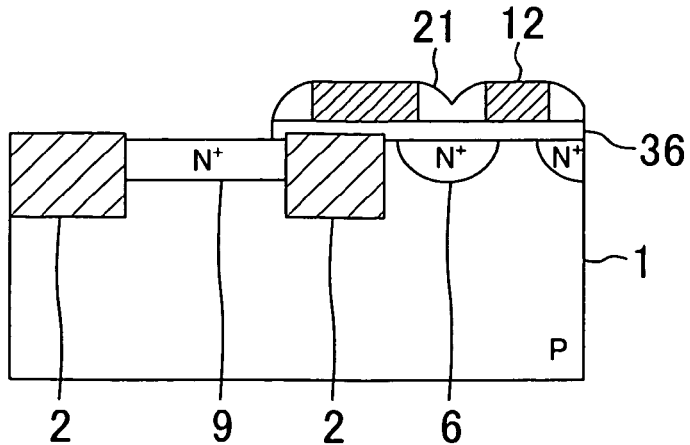

Subsequently, as shown in FIG. 22C, the formed insulating film 21 is subjected to etch back by dry etching to expose, in the memory cell array region A, the first conductive layer 12 from the insulating film 21, and also to expose, in the protective diode region B, the n-type diffusion layer 9.

Figure 23A:
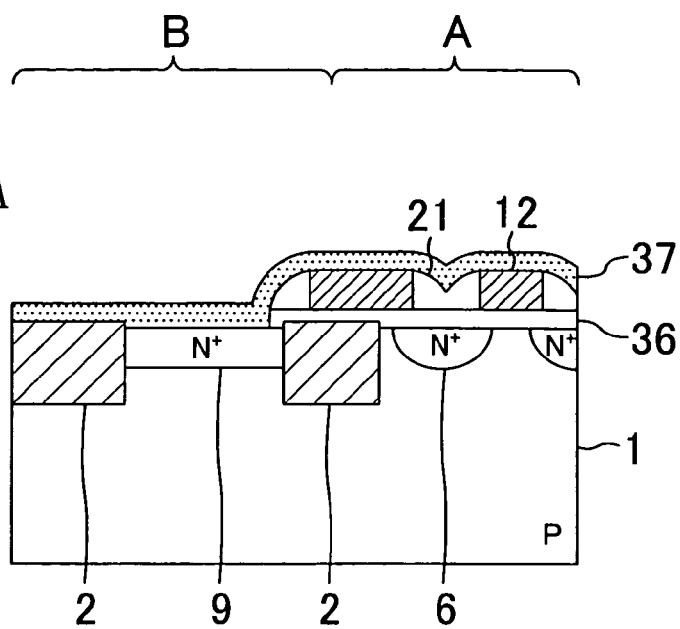
FIGS. 23A to 23C are sectional views showing the method for fabricating a semiconductor memory device according to the seventh embodiment of the present invention in the order of its fabrication process steps.

As shown in FIG. 23A, by a CVD method, the coupling capacitor insulating film 37 of an ONO film structure is formed over the entire surface on the p-type well 1, that is, on the wafer, including the exposed first conductive layer 12 and n-type diffusion layer 9.

Figure 23B:
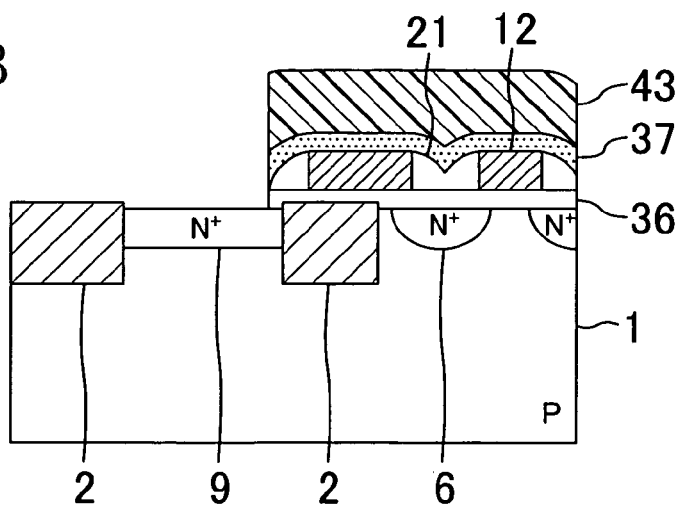

Then, as shown in FIG. 23B, by a lithography method, the second photoresist pattern 43 is formed which has a pattern with an opening exposing the coupling capacitor insulating film 37 in the protective diode region B. Using the formed second photoresist pattern 43 as a mask, the coupling capacitor insulating film 37 in the protective diode region B is removed by dry etching. Thereby, the n-type diffusion layer 9 in the protective diode region B is exposed.

Figure 23C:
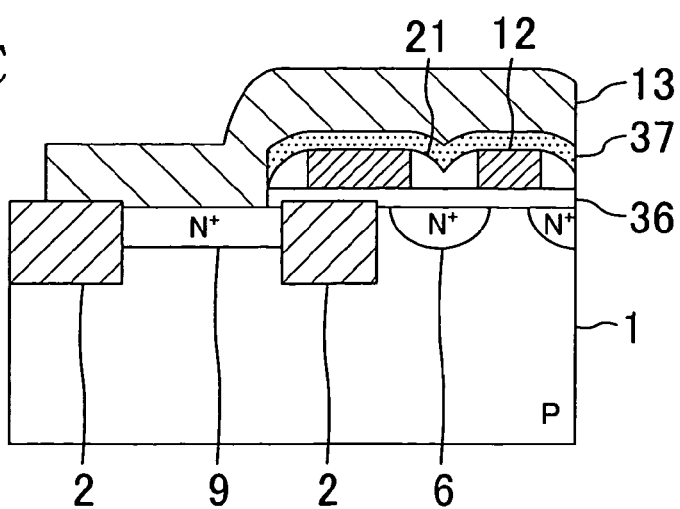

As shown in FIG. 23C, after removal of the second photoresist pattern 43, by a CVD method, the second conductive layer 13 of polycrystalline silicon is formed over the entire surface on the p-type well 1, that is, on the wafer, including the coupling capacitor insulating film 37 and the exposed n-type diffusion layer 9. Subsequently, by a lithography method, a third photoresist pattern (not shown) having a pattern with multiple openings extending in the row direction is formed on the second conductive layer 13. Using the formed third photoresist pattern as a mask, the second conductive layer 13, the coupling capacitor insulating film 37, and the first conductive layer 12 are dry etched so that the multiple first conductive layers 12 aligned in the row direction have the same potential, thereby forming the word line. In this etching, at the end of the word line, the second conductive layer 13, the coupling capacitor insulating film 37, the first conductive layer 12, and the insulating film 21 are patterned to keep the second conductive layer 13 in the state of direct connection to the n-type diffusion layer 9 exposed in the protective diode region B.

As described above, with the method for fabricating a semiconductor memory device according to the seventh embodiment, as shown in FIG. 20, even for the floating gate electrode-type memory cell, the protective diode element works in the formation processes subsequent to deposition of the second conductive layer 13 for word line formation. As a result of this, after deposition of the second conductive layer 13, stress to the tunnel oxide film 36 and the coupling capacitor insulating film 37 can be suppressed.

Eighth Embodiment

An eighth embodiment of the present invention will be described below with reference to the accompanying drawings.

Figure 24:
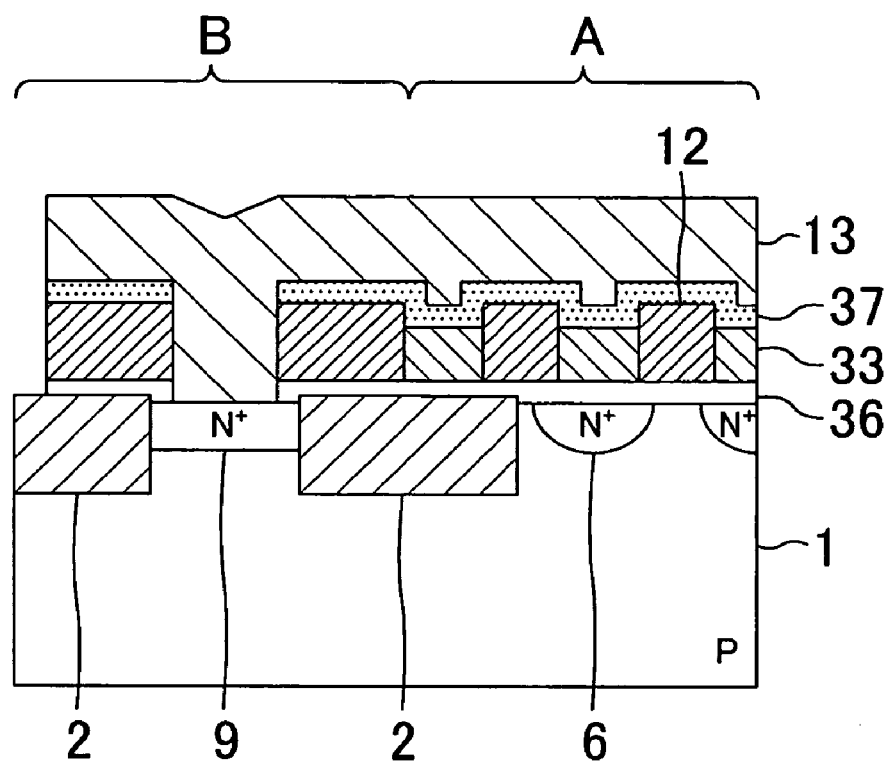
FIG. 24 is a sectional view showing a semiconductor memory device according to an eighth embodiment of the present invention.

FIG. 24 shows a cross-sectional structure of a semiconductor memory device having a floating gate electrode-type memory cell according to the eighth embodiment of the present invention. The description of the components shown in FIG. 24 that are the same as those shown in FIGS. 1 and 20 will be omitted by retaining the same reference numerals.

In the eighth embodiment, description will be made of a semiconductor memory device which has a floating gate electrode-type memory cell like the seventh embodiment and which can be miniaturized further than the semiconductor memory device according to the seventh embodiment, and of its fabrication method.

The semiconductor memory device according to the eighth embodiment has a floating gate electrode-type memory cell in the memory cell array region A like the seventh embodiment. The floating gate electrode-type memory cell has, on the p-type well 1, a stacked structure composed of the tunnel oxide film 36, the first conductive layer 12, the coupling capacitor insulating film 37, and the second conductive layer 13. The first conductive layer 12 is capacitively coupled through the coupling capacitor insulating film 37 to the second conductive layer 13, thereby functioning as a floating gate electrode.

In order to realize miniaturization of the device, like the sixth embodiment, the insulating film 33 overlying the source/drain diffusion layer (the insulating film 33) is formed only in the memory cell array region A, and not formed in the protective diode region B.

In the protective diode region B, the p-type well 1 and the n-type diffusion layer 9 formed in the upper portion of the p-type well 1 constitute a protective diode element. In this structure, in the memory cell array region A, the word line composed of the second conductive layer 13 is formed which collectively connects gate electrodes of multiple memory cells aligned in the row direction of the memory cell array. The second conductive layer 13 serving as the word line extends to the protective diode region B, and is directly connected to the n-type diffusion layer 9 formed in the upper portion of the p-type well 1 in the protective diode region B.

With the eighth embodiment, like the first to seventh embodiments, stress to the gate insulating film (the tunnel oxide film 36) can be suppressed in the formation processes. Moreover, with the structure shown in FIG. 24, no insulating film in a sidewall shape is formed in the protective diode region B like the sixth embodiment, so that the size of the protective diode region B can be reduced to miniaturize the semiconductor memory device.

Hereinafter, a fabrication method of the semiconductor memory device constructed as shown above will be described with reference to the accompanying drawings.

Figure 25A:
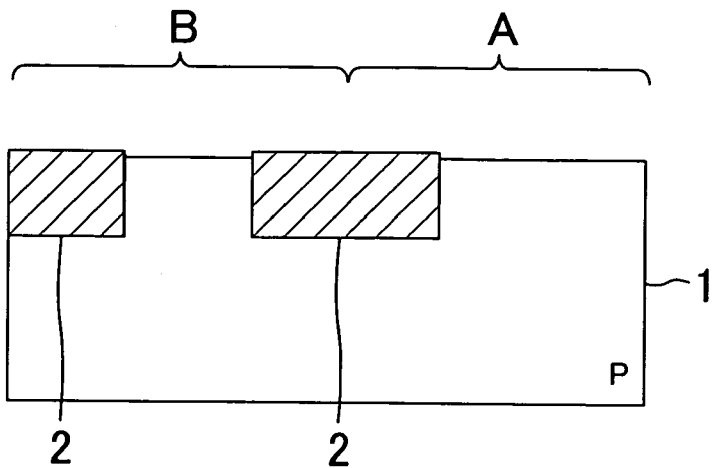
FIGS. 25A to 25C are sectional views showing a method for fabricating a semiconductor memory device according to the eighth embodiment of the present invention in the order of its fabrication process steps.

Referring to FIG. 25A, first, an isolation insulating film 2 of an STI structure is selectively formed in the upper portion of the p-type well 1 (or a p-type semiconductor substrate).

Figure 25B:
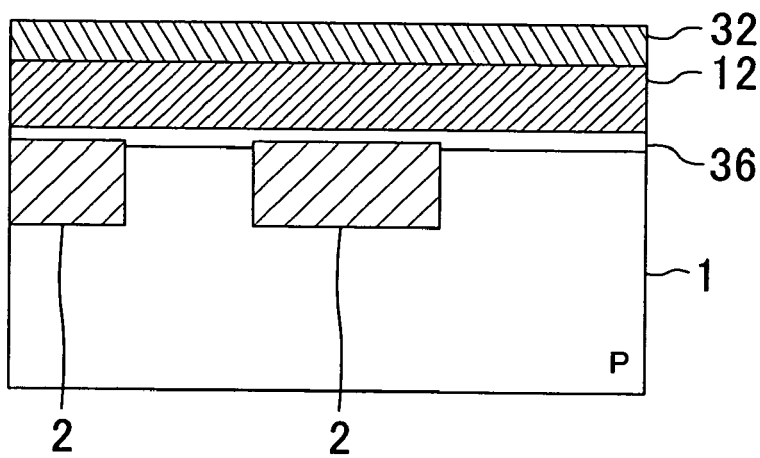

Next, as shown in FIG. 25B, for example, by a thermal oxidation method or a CVD method, the tunnel oxide film 36 of silicon oxide is formed on the entire surface of the p-type well 1 including the isolation insulating film 2. Thereafter, on the formed tunnel oxide film 36, the first conductive layer 12 of polycrystalline silicon and the insulating film 32 for gate electrode formation made of silicon nitride are sequentially formed by a CVD method.

Figure 25C:
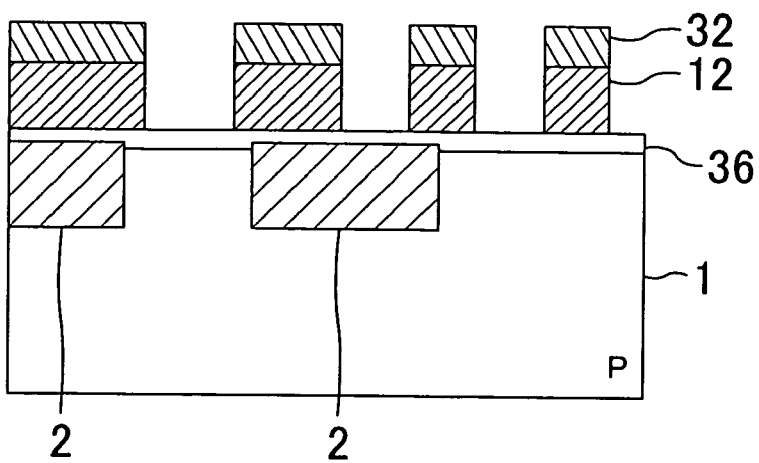

Subsequently, as shown in FIG. 25C, by a lithography method and an etching method, in the memory cell array region A, the insulating film 32 for gate electrode formation is patterned in rectangular shapes extending in the column direction, while in the protective diode region, a portion B of the insulating film 32 for gate electrode formation located above the p-type well 1 is removed. Thereafter, using the patterned insulating film 32 for gate electrode formation as a mask, the first conductive layer 12 is patterned by dry etching.

Figure 26A:
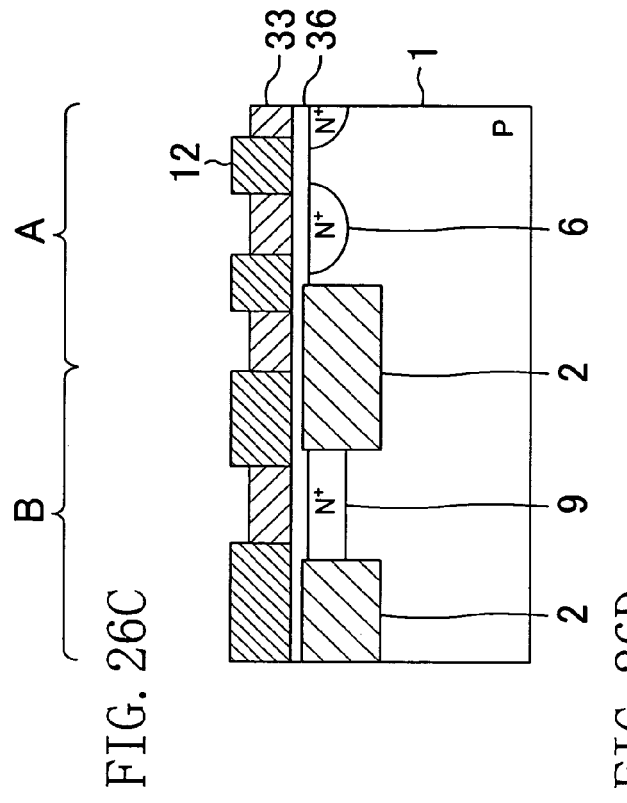
FIGS. 26A to 26D are sectional views showing the method for fabricating a semiconductor memory device according to the eighth embodiment of the present invention in the order of its fabrication process steps.

As shown in FIG. 26A, using the insulating film 32 for gate electrode formation as a mask, an n-type impurity such as arsenic (As) is implanted into the p-type well 1 to form the n-type source/drain region 6 in the memory cell array region A and the n-type diffusion layer 9 constituting the protective diode element in the protective diode region B.

Figure 26B:
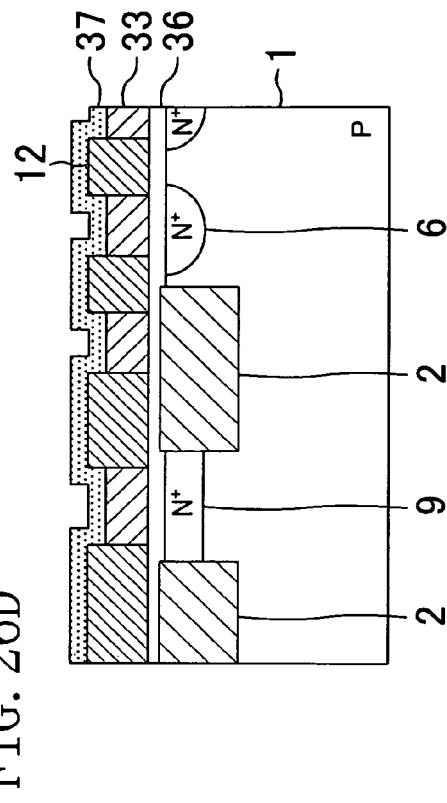

Next, as shown in FIG. 26B, by a high density plasma CVD method or the like, the insulating film 33 overlying the source/drain diffusion layer (the insulating film 33), which is made of silicon oxide, is formed over the entire surface on the p-type well 1 to cover the insulating film 32 for gate electrode formation.

Figure 26C:
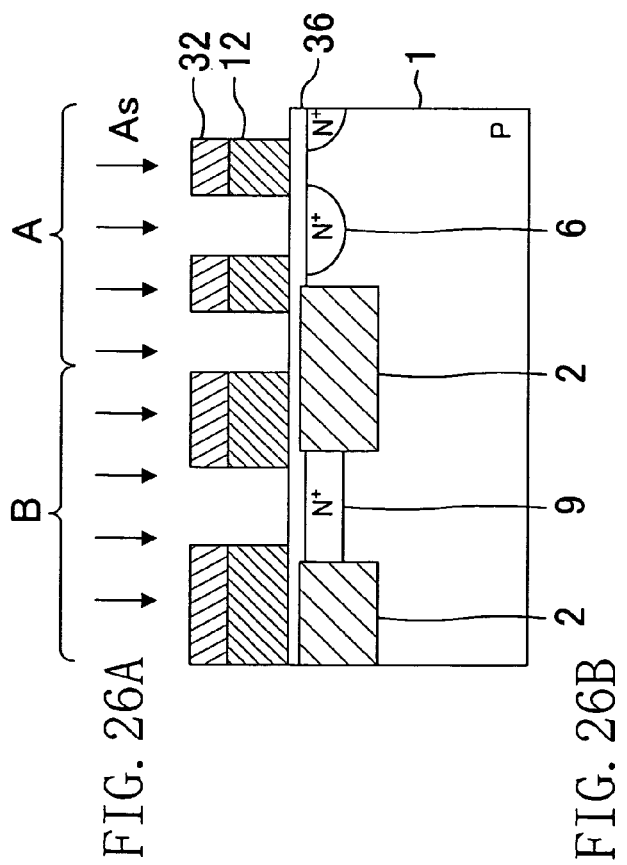

Subsequently, as shown in FIG. 26C, by a chemical mechanical polishing (CMP) method, the insulating film 33 is polished to expose the insulating film 32 for gate electrode formation, and then the insulating film 32 for gate electrode formation is removed by wet etching with hot phosphoric acid or the like.

Figure 26D:
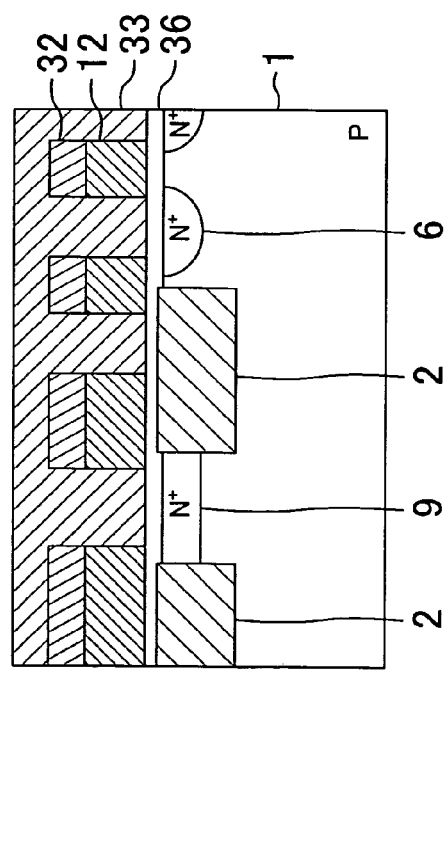

As shown in FIG. 26D, by a CVD method, the coupling capacitor insulating film 37 of an ONO film structure is formed over the entire surface on the p-type well 1, that is, on the wafer, including the exposed first conductive layer 12 and insulating film 33.

Figure 27A:
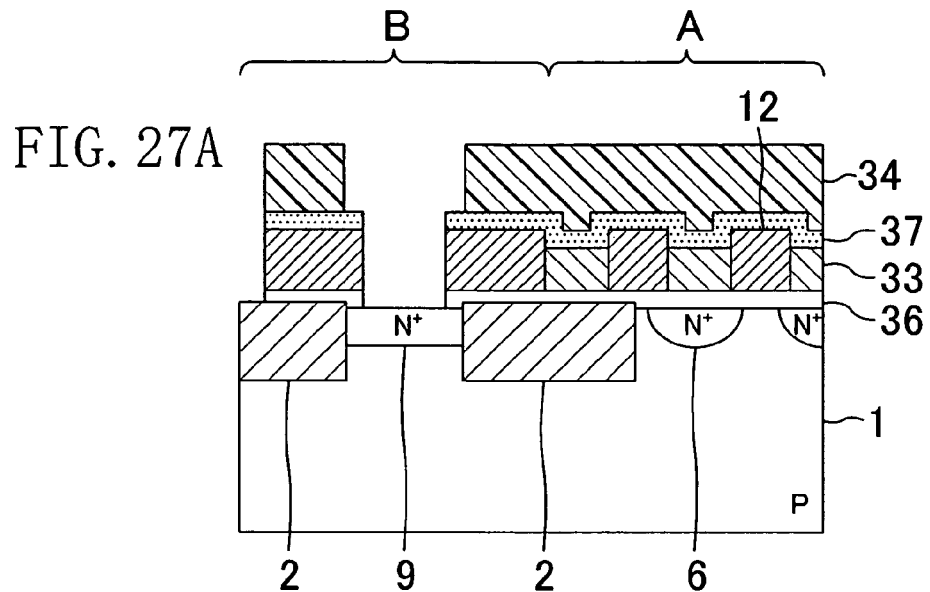
FIGS. 27A to 27C are sectional views showing the method for fabricating a semiconductor memory device according to the eighth embodiment of the present invention in the order of its fabrication process steps.

Then, as shown in FIG. 27A, by a lithography method, the first photoresist pattern 34 is formed which has an opening above the n-type diffusion layer 9 in the protective diode region B. Subsequently, using the formed first photoresist pattern 34 as a mask, the coupling capacitor insulating film 37, the insulating film 33, and the tunnel oxide film 36 in the protective diode region B are dry etched to expose the n-type diffusion layer 9 in the protective diode region B.

Figure 27B:
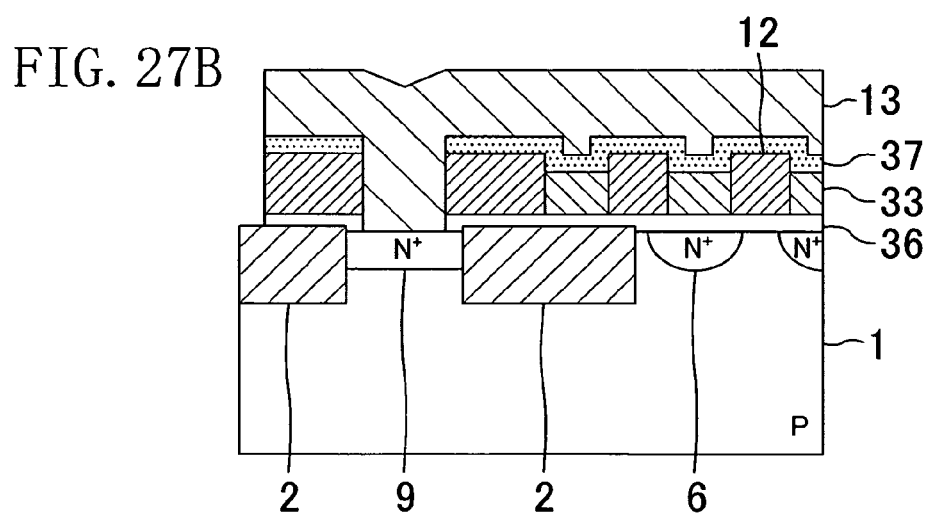

Next, as shown in FIG. 27B, the first photoresist pattern 34 is removed, and then by a CVD method, the second conductive layer 13 of polycrystalline silicon is deposited over the entire surface on the p-type well 1, that is, on the wafer, including the exposed n-type diffusion layer 9. Thereby, in the protective diode region B, the second conductive layer 13 is brought into direct connection to the n-type diffusion layer 9.

Figure 27C:
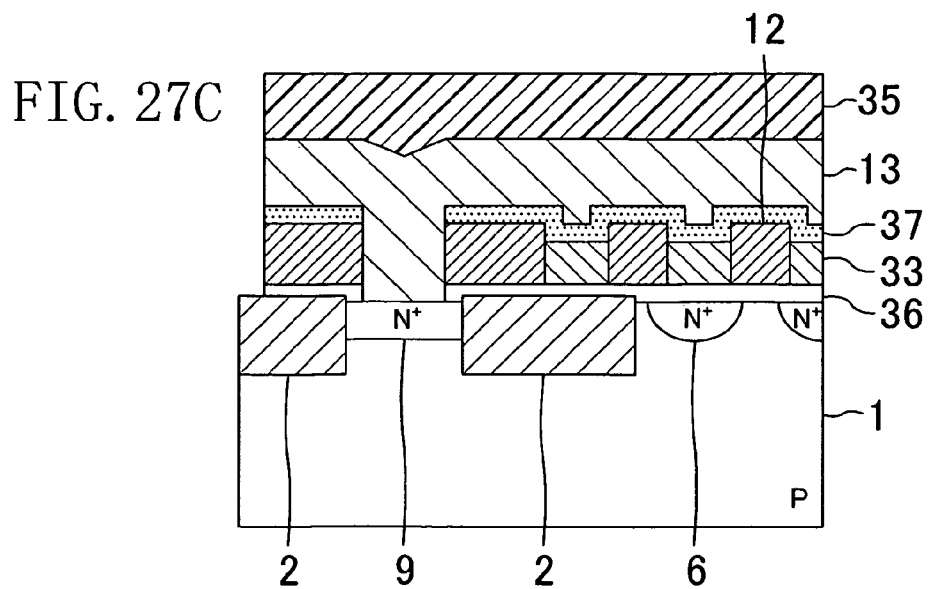

Then, as shown in FIG. 27C, on the second conductive layer 13, the second photoresist pattern 35 is formed which has a pattern with multiple openings extending in the row direction. Subsequently, using the formed second photoresist pattern 35 as a mask, the second conductive layer 13, the coupling capacitor insulating film 37, and the first conductive layer 12 are dry etched so that the multiple first conductive layers 12 aligned in the row direction have the same potential, thereby forming the word line. In this etching, at the end of the word line, the second conductive layer 13, the coupling capacitor insulating film 37, the first conductive layer 12, and the insulating film 33 are patterned to keep the second conductive layer 13 in the state of direct connection to the n-type diffusion layer 9 exposed in the protective diode region B.

As described above, with the method for fabricating a semiconductor memory device according to the eighth embodiment, as shown in FIG. 24, the second conductive layer 13 constituting the word line is directly connected to the n-type diffusion layer 9 constituting the protective diode element. Therefore, even for the floating gate electrode-type memory cell, the protective diode element works in the formation processes subsequent to deposition of the second conductive layer 13 for word line formation. As a result of this, after deposition of the second conductive layer 13, stress to the tunnel oxide film 36 and the coupling capacitor insulating film 37 can be suppressed. Moreover, like the sixth embodiment, the distance between the memory cells can be reduced, and also the size of the protective diode region B can be reduced.

Ninth Embodiment

A ninth embodiment of the present invention will be described below with reference to the accompanying drawings.

In the ninth embodiment, description will be made of how the semiconductor memory devices mentioned in the third to fifth and seventh embodiments are operated in write, erase, and read operations on the memory cell thereof. In particular, in the protective diode element formed in the protective diode region in the device according to the present invention, a plurality of pn junctions are present. Thus, in order to prevent the potential of the node of each of the pn junctions from becoming unstable, it is necessary to appropriately apply the potentials of the nodes.

Figure 28:
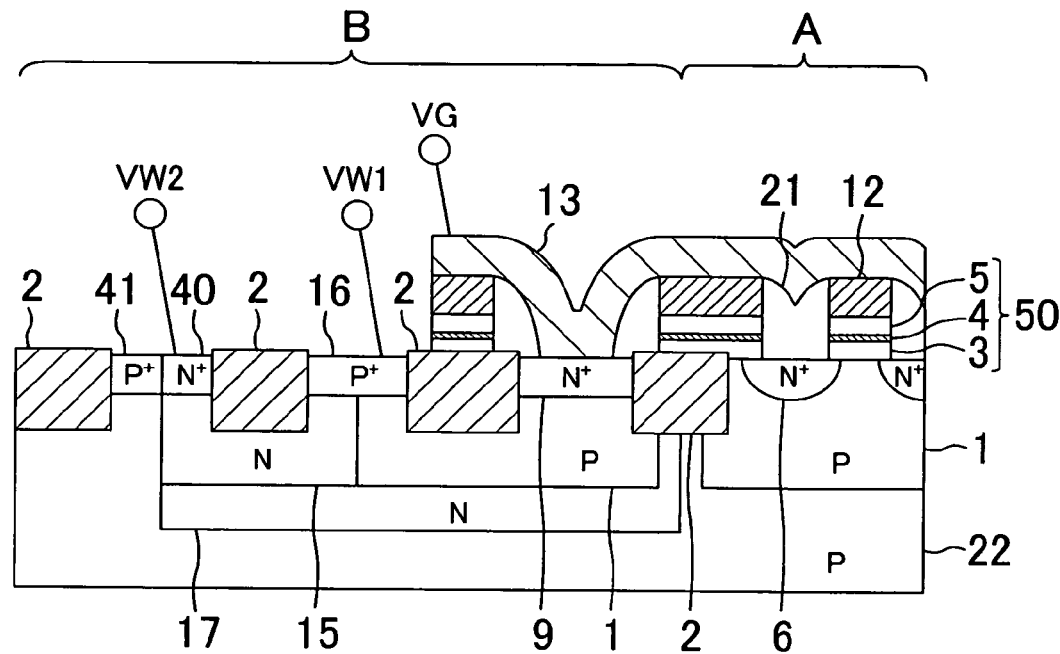
FIG. 28 is a sectional view showing a method for operating a semiconductor memory device according to a ninth embodiment of the present invention, which schematically shows the structure of terminals in the case of operating a memory cell in the semiconductor memory device according to the fifth embodiment of the present invention.

FIG. 28 shows the structure of terminals required to operate the memory cell in the semiconductor memory device shown in the fifth embodiment. VG is a gate terminal connected to the second conductive layer 13 constituting the word line and the gate electrode, and controls the potential of the word line connected to each memory cell. VW1 is a first well terminal connected to the p-type diffusion layer 16 formed in the upper portions of the p-type well 1 and the n-type well 1 in the protective diode region B to extend across the junction between therebetween, and controls the potential of the p-type well 1. VW2 is a second well terminal connected to the p-type diffusion layer 40 and the n-type diffusion layer 41 in the protective diode region B, and controls the potentials of the deep n-type well 17, the n-type well 15, and the p-type semiconductor substrate 22.

Figure 29:
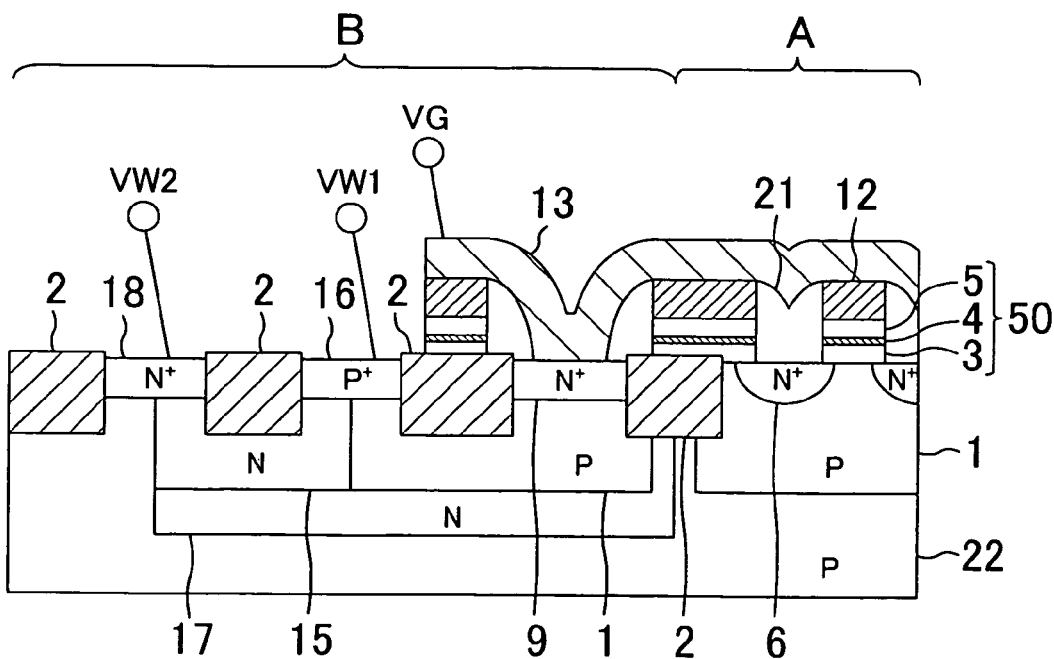
FIG. 29 is a sectional view showing a method for operating a semiconductor memory device according to the ninth embodiment of the present invention, which schematically shows the structure of terminals in the case of operating a memory cell in the semiconductor memory device according to the third embodiment of the present invention.

FIG. 29 shows the structure of terminals required to operate the memory cell in the semiconductor memory device shown in the third embodiment. As in the case shown in FIG. 28, VG is a gate terminal connected to the second conductive layer 13, and controls the potential of the word line connected to each memory cell. VW1 is a first well terminal connected to the p-type diffusion layer 16 in the protective diode region B, and controls the potential of the p-type well 1. VW2 is a second well terminal connected to the n-type diffusion layer 18 in the protective diode region B, and controls the potentials of the deep n-type well 17, the n-type well 15, and the p-type semiconductor substrate 22.

Figure 30:
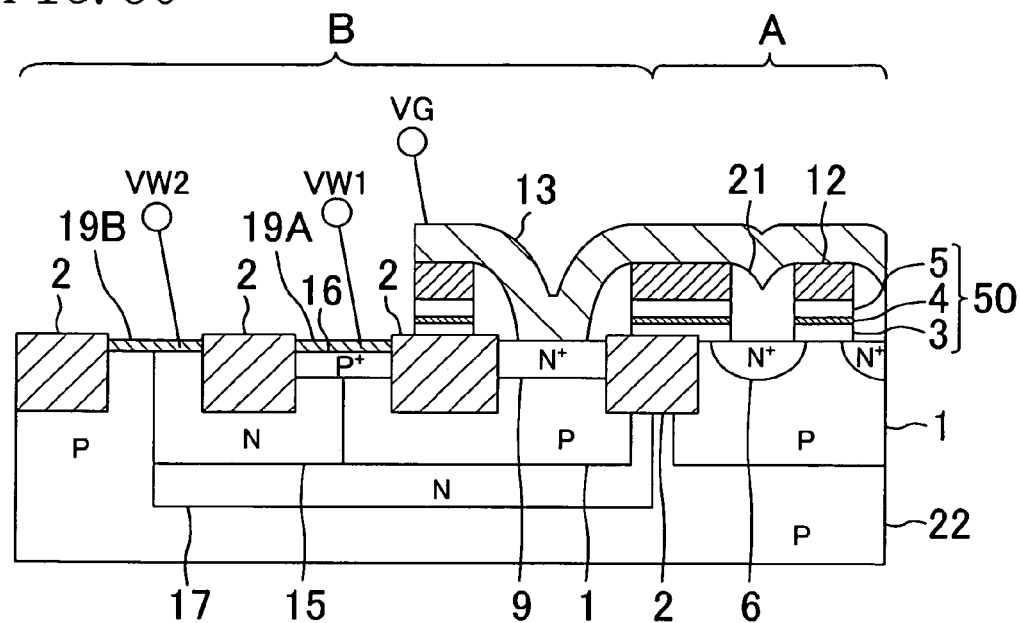
FIG. 30 is a sectional view showing a method for operating a semiconductor memory device according to the ninth embodiment of the present invention, which schematically shows the structure of terminals in the case of operating a memory cell in the semiconductor memory device according to the fourth embodiment of the present invention.

FIG. 30 shows the structure of terminals required to operate the memory cell in the semiconductor memory device shown in the fourth embodiment. As in the case shown in FIG. 28, VG is a gate terminal connected to the second conductive layer 13, and controls the potential of the word line connected to each memory cell. VW1 is a first well terminal connected through the first silicide area 19A to the p-type diffusion layer 16 in the protective diode region B, and controls the potential of the p-type well 1. VW2 is a second well terminal connected through the second silicide area 19B to the n-type well 15 and the p-type semiconductor substrate 22 in the protective diode region B, and controls the potentials of the deep n-type well 17, the n-type well 15, and the p-type semiconductor substrate 22.

As shown above, in any structures in FIGS. 28, 29, and 30, the gate terminal VG controls the potential of the word line in the memory cell, the first well terminal VW1 controls the potential of the p-type well 1, and the second well terminal VW2 controls the potentials of the deep n-type well 17, the n-type well 15, and the p-type semiconductor substrate 22.

Figure 31:
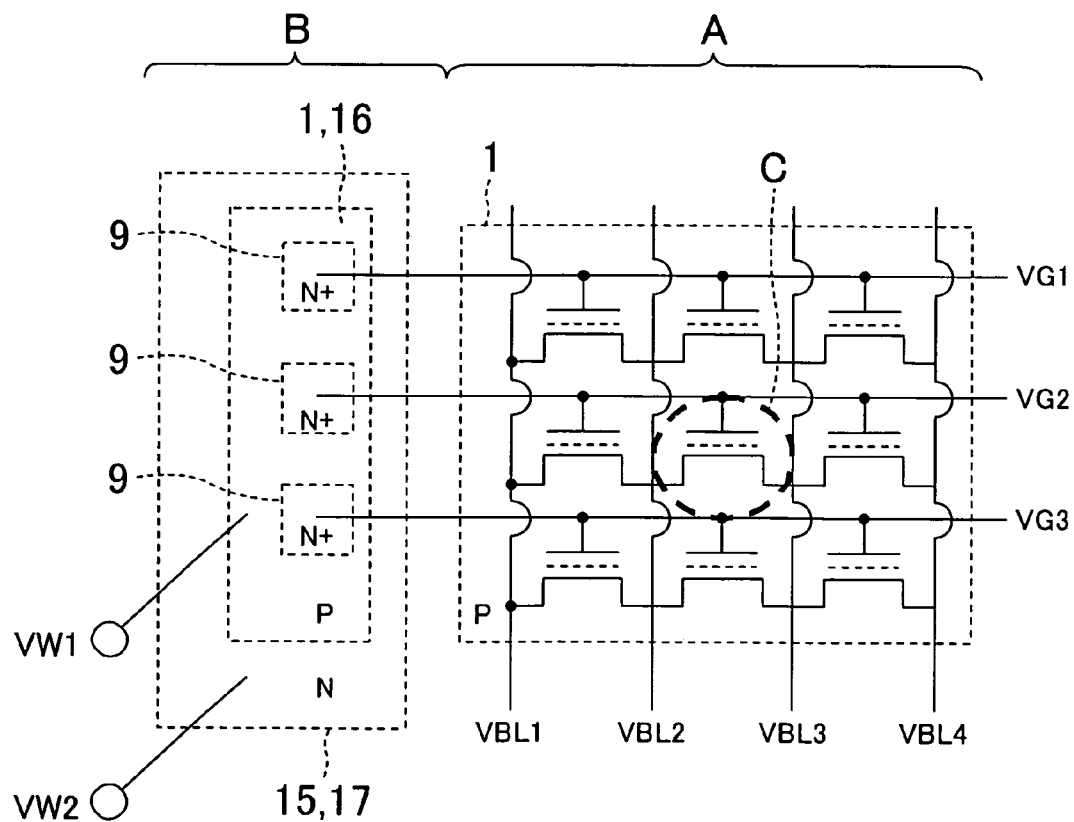
FIG. 31 is a plan view schematically showing the structure of terminals in the case of operating a memory cell of the semiconductor memory device in the method for operating a semiconductor memory device according to the ninth embodiment of the present invention.
Figure 32:
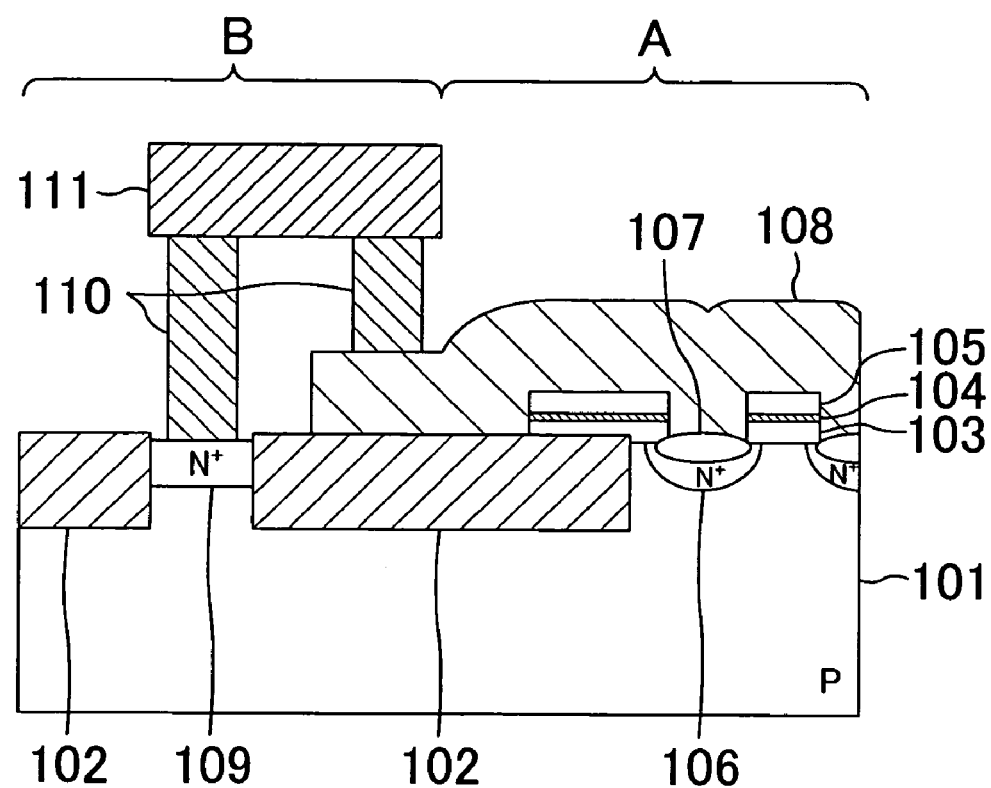
FIG. 32 is a sectional view showing a conventional semiconductor memory device.

FIG. 31 schematically shows the memory cell array region A and the protective diode region B in the semiconductor memory device according to the present invention. In this figure, the first well terminal VW1 and the second well terminal VW2 are associated with those in FIGS. 28, 29, and 30, and the other reference numerals are also associated with those in FIGS. 28, 29, and 30. In FIG. 31, the gate terminal VG shown in FIGS. 28, 29, and 30 is associated with the first gate terminal VG1, the second gate terminal VG2, and the third gate terminal VG3 connected to the respective word lines. Bit line terminals VBL1 to VBL4 are terminals connected to the respective source/drain diffusion layers 6.

Table 1 shows the bias conditions of the terminals in write, erase, and read operations. Write operation and read operation are performed on a selected cell C shown in FIG. 31. Erase operation is performed on all memory cells connected to a selected source/drain diffusion layer.

Note that the operations shown are obtained assuming that a MONOS-type memory cell is employed. In this assumption, write operation is performed by injecting into the charge storage layer 4 electrons generated by CHE (Channel Hot Electron), and erase operation is performed by injecting into the charge storage layer 4 holes generated by BTBT (Band To Band Tunneling) current.

TABLE 1

|  | VW1 | VW2 | VG1 | VG2 | VG3 | VBL1 | VBL2 | VBL3 | VBL4 |
| --- | --- | --- | --- | --- | --- | --- | --- | --- | --- |
| WRITE | 0 V | 0 V | 0 V | 9 V | 0 V | 0 V | 0 V | 5 V | OPEN |
| ERASE | −5 V | 0 V | −5 V | −5 V | −5 V | OPEN | OPEN | 5 V | OPEN |
| READ | 0 V | 0 V | 0 V | 4 V | 0 V | OPEN | 1 V | 0 V | OPEN |

(Write Operation)

First Description is Made of Write Operation.

The write operation should be performed on a predetermined one bit, that is, one memory cell. Therefore, a high positive voltage is applied only to a word line connected to a selected cell C. In this operation, a voltage of 9 V is applied to the second gate terminal VG2 connected to the selected word line. The first gate terminal VG1 and the third gate terminal VG3 connected to unselected word lines are set to be grounded (0 V). By setting the first well terminal VW1 and the second well terminal VW2 to be grounded, the potentials of the p-type well 1, the deep n-type well 17, the n-type well 15, and the p-type semiconductor substrate 22 in the protective diode region B are set at 0 V. At this time, the pn junction between the n-type diffusion layer 9 and the p-type well 1 in the protective diode region B is in the state in which the potential difference between the second gate terminal VG2 and the first well terminal VW1 is applied in the reverse direction. However, the breakdown voltage of the pn junction between the n-type diffusion layer 9 and the p-type well 1 is set at about 10 V. Therefore, as long as the voltage difference between the second gate terminal VG2 and the first well terminal VW1 is 9 V, the pn junction will not be clamped and the p-type well 1 is kept at 0 V.

Assuming that the first well terminal VW1 is not grounded but open-circuit, the p-type well 1 in the protective diode region B may have an unstable potential to delay the rise of the potential of the selected word line, which probably leads to a decrease in writing speed. In addition, fixing the first well terminal VW1 at a positive potential produces a forward voltage with respect to the second well terminal VW2, so that the potentials of the wells in the protective diode region B become unstable, which is undesirable. In contrast to this, fixing the first well terminal VW1 at a negative voltage increases the potential difference with respect to the word line, so that the breakdown voltage of the pn junction between the n-type diffusion layer 9 and the p-type well 1 in the protective diode region B should be set at a high value. However, this will raise the voltage given to the word line by electrical charging in the fabrication process, which contributes to charge injection into the charge storage layer 4 and stress to the gate insulating film. Accordingly, the first well terminal VW1 should be set not in an open-circuit state but in a grounded state having the same potential as the second well terminal VW2.

(Erase Operation)

Second Description is Made of Erase Operation.

The erase operation should be performed on multiple bits at a time. In the ninth embodiment, in order to erase information in all memory cells connected to one source/drain diffusion layer 6, a negative voltage with a large absolute value is applied to all word lines. In this operation, a voltage of −5 V is applied to the gate terminals VG1 to VG3 of all word lines. To the first well terminal VW1, a voltage of −5 V is applied which is identical to those applied to the gate terminals VG1 to VG3. The second well terminal VW2 is set to be grounded, so that the deep n-type well 17, the n-type well 15, and the p-type semiconductor substrate 22 in the protective diode region B are set at 0 V. At this time, the potential difference between the p-type well 1 and the n-type well 15 in the protective diode region B becomes a reverse voltage with respect to the pn junction between the p-type diffusion layer 16 and the n-type well 15 in the protective diode region, and in addition the breakdown voltage is set at a great value higher than this potential difference. Therefore, a further drop of the negative potential of the word line is avoided.

In the case where the first well terminal VW1 is not set at −5 V which is the same voltage as the word line, the p-type well 1 in the protective diode region B may have an unstable potential to delay the rise of the potential of the selected word lines, which probably leads to a decrease in erasing speed. Accordingly, the first well terminal VW1 should be set to have the same potential as the word line.

(Read Operation)

Third Description is Made of Read Operation.

The read operation should be performed on a predetermined one bit, that is, one memory cell. Therefore, a positive voltage is applied only to a word line connected to a selected cell C. In this operation, a voltage of 4 V is applied to the second gate terminal VG2 connected to the selected word line. The first gate terminal VG1 and the third gate terminal VG3 connected to unselected word lines are set to be grounded (0 V). The first well terminal VW1 and the second well terminal VW2 are set to be grounded as in the write operation, so that the potentials of the p-type well 1, the deep n-type well 17, the n-type well 15, and the p-type semiconductor substrate 22 in the protective diode region B are set at 0 V. At this time, the pn junction between the n-type diffusion layer 9 and the p-type well 1 in the protective diode region B is in the state in which the potential difference between the second gate terminal VG2 and the first well terminal VW1 is applied in the reverse direction. However, if the pn junction is set not to be clamped in the write operation described above, no trouble arises therefrom because this potential difference is smaller in the read operation than in the write operation.

Assuming that the first well terminal VW1 is not grounded but open-circuit, the p-type well 1 in the protective diode region B may have an unstable potential as in the write operation to delay the rise of the potential of the selected word line, which probably leads to a decrease in reading speed. Therefore, the first well terminal VW1 should be set not in an open-circuit state but in the state of application of a predetermined potential.

In the ninth embodiment, operations employing the MONOS-type memory cell have been described. Even in the case of employing the floating gate electrode-type memory cell shown in the seventh or eighth embodiment, in operations such as write operation, the polarities of the voltages applied to the word lines are identical to those of the MONOS-type memory cell. Thus, it is sufficient that the potentials applied to the first well terminal VW1 and the second well terminal VW2 are set identical to those in the ninth embodiment. In this case, write operation is performed by injecting in the charge storage layer electrons generated from CHE (Channel Hot Electron), and erase operation is performed by removing, by F-N (Fowler-Nordheim) current, electrons from the charge storage layer.

As described above, with the method for operating a semiconductor memory device according to the ninth embodiment, the potentials of the nodes can be kept stable. This enables stable write, erase, and read operations on the memory cell.

In the first to ninth embodiments described above, the MONOS-type nonvolatile semiconductor memory device or the floating gate electrode-type nonvolatile semiconductor memory device has been employed as an example, but the present invention is not limited to these devices.

As is apparent from the above, with the semiconductor memory device and its fabrication method according to the present invention, the memory cell can be protected from a high voltage applied by electrical charging of the gate electrode even during the processes conducted between formation of the contact containing refractory metal and deposition of the conductive film serving as an interconnect layer. Therefore, the present invention is useful especially for nonvolatile semiconductor memory devices such as EEPROMs.

What is claimed is:

1. A semiconductor memory device comprising:
a memory cell array region formed in a semiconductor region of a first conductivity type and having a plurality of memory cells arranged in rows and columns;
a plurality of word lines each of which collectively connects ones of the plurality of memory cells aligned in the same row; and
a protective diode region formed in the semiconductor region to be separated from the memory cell array region,
wherein in the protective diode region, a protective diode element is constructed by making a junction between a first diffusion layer of a second conductivity type formed in the upper portion of the semiconductor region and the semiconductor region, and
each of the word lines extends to the protective diode region and is brought into direct connection to the first diffusion layer of the second conductivity type, thereby making electrical connection to the protective diode element.

2. The device of claim 1,
wherein the protective diode region further includes: a well of the first conductivity type formed of the semiconductor region; a first well of the second conductivity type adjacent to the side of the well of the first conductivity type located away from the memory cell array region; and a first diffusion layer of the first conductivity type formed in the upper portions of the well of the first conductivity type and the first well of the second conductivity type to extend across the junction therebetween, and
the protective diode element is constructed of the first diffusion layer of the second conductivity type, the well of the first conductivity type, the first diffusion layer of the first conductivity type, and the first well of the second conductivity type.

3. The device of claim 2,
wherein the well of the first conductivity type and the first well of the second conductivity type are formed in a semiconductor substrate of the first conductivity type,
the protective diode region further includes: a second well of the second conductivity type containing the well of the first conductivity type and the first well of the second conductivity type and having a junction plane deeper than the well of the first conductivity type and the first well of the second conductivity type; and a second diffusion layer of the second conductivity type formed in the upper portions of the first well of the second conductivity type and the semiconductor substrate to extend across the junction therebetween, and
the protective diode element is constructed of the first diffusion layer of the second conductivity type, the well of the first conductivity type, the first diffusion layer of the first conductivity type, the first well of the second conductivity type, the second well of the second conductivity type, and the second diffusion layer of the second conductivity type.

4. The device of claim 2,
wherein the well of the first conductivity type and the first well of the second conductivity type are formed in a semiconductor substrate of the first conductivity type, the protective diode region further includes: a second well of the second conductivity type containing the well of the first conductivity type and the first well of the second conductivity type and having a junction plane deeper than the well of the first conductivity type and the first well of the second conductivity type; a first silicide region made from metal and formed on top of the first diffusion layer of the first conductivity type; and a second silicide region made from metal and formed on top of the first well of the second conductivity type and the semiconductor substrate to extend across the junction therebetween, and
the protective diode element is constructed of the first diffusion layer of the second conductivity type, the well of the first conductivity type, the first diffusion layer of the first conductivity type, the first silicide region, the first well of the second conductivity type, the second well of the second conductivity type, and the second silicide region.

5. The device of claim 2,
wherein the well of the first conductivity type and the first well of the second conductivity type are formed in a semiconductor substrate of the first conductivity type,
the protective diode region further includes: a second well of the second conductivity type containing the well of the first conductivity type and the first well of the second conductivity type and having a junction plane deeper than the well of the first conductivity type and the first well of the second conductivity type; a second diffusion layer of the second conductivity type formed in the upper portion of the first well of the second conductivity type away from the first diffusion layer of the first conductivity type; and a second diffusion layer of the first conductivity type formed in the upper portion of the semiconductor substrate adjacent to the second diffusion layer of the second conductivity type, and
the protective diode element is constructed of the first diffusion layer of the second conductivity type, the well of the first conductivity type, the first diffusion layer of the first conductivity type, the first well of the second conductivity type, the second well of the second conductivity type, the second diffusion layer of the second conductivity type, and the second diffusion layer of the first conductivity type.

6. The device of claim 3,
wherein a first silicide region made from metal is formed on top of the first diffusion layer of the first conductivity type, and a second silicide region made from metal is formed on top of the second diffusion layer of the second conductivity type.

7. The device of claim 5,
wherein a first silicide region made from metal is formed on top of the first diffusion layer of the first conductivity type, and a second silicide region made from metal is formed to extend across the top of the second diffusion layer of the second conductivity type and the top of the second diffusion layer of the first conductivity type.

8. The device of claim 1,
wherein an insulating film is formed between the adjacent memory cells in the memory cell array region, and the insulating film is not formed on the first diffusion layer of the second conductivity type in the protective diode region.

9. The device of claim 1,
wherein the word lines are constructed of: first conductive layers formed in the plurality of memory cells, respectively; and second conductive layers each of which collectively connects ones of the multiple first conductive layers aligned in the same row.

10. The device of claim 9,
wherein the memory cells are MONOS-type memory cells which each have a stacked insulating film formed between the first semiconductor region and associated one of the first conductive layers and made by interposing a nitride film between oxide films.

11. The device of claim 1,
wherein the word lines are constructed of: first conductive layers formed in the plurality of memory cells, respectively; and second conductive layers each of which capacitively couples ones of the multiple first conductive layers aligned in the same row so that an insulating film is interposed therebetween.

12. The device of claim 11,
wherein the memory cells are floating gate electrode-type memory cells each having a tunnel insulating film formed between the first semiconductor region and associated one of the first conductive layers.

13. A method for fabricating a semiconductor memory device,
wherein a memory cell array region having a plurality of memory cells arranged in rows and columns and a protective diode region are formed separately on a semiconductor region of a first conductivity type, and
the method comprises:
the step (a) of selectively forming an isolation insulating film in the semiconductor region;
the step (b) of sequentially forming, on the semiconductor region including the isolation insulating film, an ONO film including a first silicon oxide film, a silicon nitride film, and a second silicon oxide film, and a first conductive layer;
the step (c) of patterning, in the memory cell array region, the first conductive layer and the ONO film in rectangular shapes extending in the column direction, and also patterning, in the protective diode region, the first conductive layer for removal;
the step (d) of forming, after the step (c), a source/drain region of each of the memory cells formed of a diffusion layer of a second conductivity type in the memory cell array region in the semiconductor region, and also a diffusion layer of the second conductivity type forming a protective diode element in the protective diode region in the semiconductor region, the step (d) being performed using the patterned first conductive layer as a mask;
the step (e) of forming, after the step (d), an insulating film on the semiconductor region including the patterned first conductive layer, and then exposing the top surface of the patterned first conductive layer in the memory cell array region;
the step (f) of exposing, after the step (d), at least a portion of the diffusion layer of the second conductivity type in the protective diode region;
the step (g) of forming, after the step (f), a second conductive layer over the memory cell array region and the protective diode region in the semiconductor region; and
the step (h) of patterning, after the step (g), in the memory cell array region, the second conductive layer and the first conductive layer in the row direction to form the plurality of memory cells and a plurality of word lines, and also making, in the protective diode region, direct connection between the diffusion layer of the second conductivity type of the protective diode element and an end of an associated one of the word lines, the plurality of memory cells including the patterned first conductive layers, respectively, the plurality of memory cells being arranged in rows and columns, the plurality of word lines being formed of the patterned second conductive layers, respectively, the plurality of word lines each collectively connecting ones of the plurality of memory cells aligned in the same row.

14. The fabrication method of claim 13,
wherein the steps (e) and (f) are carried out in the manner in which the formed insulating film is etched to expose the top surfaces of the first conductive layers and fill spaces between the adjacent first conductive layers and the adjacent ONO films in the memory cell array region, and also to expose at least a portion of the diffusion layer of the second conductivity type in the protective diode region.

15. The fabrication method of claim 13,
wherein the step (e) is carried out in the manner in which the formed insulating film is polished by a chemical mechanical polishing method to expose the top surface of the first conductive layer in the memory cell array region, and
the step (f) is carried out in the manner in which in the protective diode region, the insulating film is etched to expose at least a portion of the diffusion layer of the second conductivity type.

16. The fabrication method of claim 13,
wherein in the step (c), patterning is conducted to additionally remove the ONO film in the protective diode region.

17. The fabrication method of claim 13,
wherein the step (b) includes substeps of:
selectively removing the ONO film in the protective diode region; and
selectively forming a third silicon oxide film in the protective diode region with the ONO film removed therefrom.

18. A method for fabricating a semiconductor memory device,
wherein a memory cell array region having a plurality of memory cells arranged in rows and columns and a protective diode region are formed separately on a semiconductor region of a first conductivity type, and
the method comprises:
the step (a) of selectively forming an isolation insulating film in the semiconductor region;
the step (b) of sequentially forming a tunnel insulating film and a first conductive layer on the semiconductor region including the isolation insulating film;
the step (c) of patterning, in the memory cell array region, the first conductive layer in rectangular shapes extending in the column direction, and also patterning, in the protective diode region, the first conductive layer for removal;
the step (d) of forming, after the step (c), a source/drain region of each of the memory cells formed of a diffusion layer of a second conductivity type in the memory cell array region in the semiconductor region, and also a diffusion layer of the second conductivity type forming a protective diode element in the protective diode region in the semiconductor region, the step (d) being performed using the patterned first conductive layer as a mask;
the step (e) of forming, after the step (d), an insulating film on the semiconductor region including the patterned first conductive layer, and then exposing the top surface of the patterned first conductive layer in the memory cell array region;

the step (f) of exposing, after the step (d), at least a portion of the diffusion layer of the second conductivity type in the protective diode region;

the step (g) of selectively forming, in the memory cell array region, a coupling capacitor insulating film on the first conductive layer with the top surface exposed;

the step (h) of forming, after the step (g), a second conductive layer over the memory cell array region and the protective diode region in the semiconductor region; and the step (i) of patterning, after the step (h), in the memory cell array region, the second conductive layer, the coupling capacitor insulating film, and the first conductive layer in the row direction to form the plurality of memory cells and a plurality of word lines, and also making, in the protective diode region, direct connection between the diffusion layer of the second conductivity type of the protective diode element and an end of an associated one of the word lines, the plurality of memory cells including the patterned first conductive layers and the patterned coupling capacitor insulating films, respectively, the plurality of memory cells being arranged in rows and columns, the plurality of word lines being formed of the patterned second conductive layers, respectively, the plurality of word lines each collectively connecting ones of the plurality of memory cells aligned in the same row.

19. The fabrication method of claim 18,
wherein the steps (e) and (f) are carried out in the manner in which the formed insulating film is etched to expose the top surfaces of the first conductive layers and fill spaces between the adjacent first conductive layers in the memory cell array region, and also to expose at least a portion of the diffusion layer of the second conductivity type in the protective diode region.

20. The fabrication method of claim 18,
wherein the step (e) is carried out in the manner in which the formed insulating film is polished by a chemical mechanical polishing method to expose the top surfaces of the first conductive layers in the memory cell array region, and
the steps (f) and (g) are carried out in the manner in which in the protective diode region, the coupling capacitor insulating film and the insulating film are etched to expose at least a portion of the diffusion layer of the second conductivity type.

21. A method for operating the semiconductor memory device of claim 5, comprising the steps of:
connecting a first terminal to the word line, a second terminal to the first diffusion layer of the first conductivity type, and a third terminal to the second diffusion layer of the second conductivity type and the second diffusion layer of the first conductivity type; and
setting the second and third terminals to be grounded in applying a positive bias voltage to the first terminal.

22. The operating method of claim 21, further comprising the step of applying a positive bias voltage to the first terminal to perform one of write operation and read operation on a selected memory cell.

23. A method for operating the semiconductor memory device of claim 5, comprising the steps of:
connecting a first terminal to the word line, a second terminal to the first diffusion layer of the first conductivity type, and a third terminal to the second diffusion layer of the second conductivity type and the second diffusion layer of the first conductivity type; and
applying, in applying a negative bias voltage to the first terminal, the same voltage as the first terminal to the second terminal and setting the third terminal to be grounded.

24. The operation method of claim 23, further comprising the step of applying a negative bias voltage to the first terminal to perform erase operation on a selected memory cell.

25. A method for operating the semiconductor memory device of claim 3, comprising the steps of:
connecting a first terminal to the word line, a second terminal to the first diffusion layer of the first conductivity type, and a third terminal to the second diffusion layer of the second conductivity type;
applying a positive bias voltage to the first terminal to perform one of write operation and read operation on a selected memory cell; and
applying a negative bias voltage to the first terminal to perform erase operation to a selected memory cell.

26. A method for operating the semiconductor memory device of claim 4, comprising the steps of:
connecting a first terminal to the word line, a second terminal to the first silicide region, and a third terminal to the second silicide region;
applying a positive bias voltage to the first terminal to perform one of write operation and read operation on a selected memory cell; and
applying a negative bias voltage to the first terminal to perform erase operation on a selected memory cell.

* * * * *